(12) United States Patent
Wu et al.

(10) Patent No.: US 11,849,617 B2
(45) Date of Patent: Dec. 19, 2023

(54) DISPLAY PANEL AND DISPLAY DEVICE

(71) Applicants: Hefei BOE Joint Technology Co., Ltd., Anhui (CN); BOE Technology Group Co., Ltd., Beijing (CN)

(72) Inventors: Zhongyuan Wu, Beijing (CN); Yongqian Li, Beijing (CN); Can Yuan, Beijing (CN); Zhidong Yuan, Beijing (CN); Meng Li, Beijing (CN); Dacheng Zhang, Beijing (CN); Lang Liu, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 777 days.

(21) Appl. No.: 16/976,796

(22) PCT Filed: Nov. 29, 2019

(86) PCT No.: PCT/CN2019/122189
§ 371 (c)(1),
(2) Date: Aug. 31, 2020

(87) PCT Pub. No.: WO2021/103003
PCT Pub. Date: Jun. 3, 2021

(65) Prior Publication Data
US 2023/0157110 A1    May 18, 2023

(51) Int. Cl.
*H10K 59/131* (2023.01)
(52) U.S. Cl.
CPC .............................. *H10K 59/1315* (2023.02)

(58) Field of Classification Search
CPC ........... H10K 59/1315; H10K 59/1213; H10K 59/126; H10K 59/131; H10K 59/80522;
(Continued)

(56) References Cited

U.S. PATENT DOCUMENTS

| 2005/0186839 A1 | 8/2005 | Matsueda et al. |
| 2014/0209889 A1 | 7/2014 | Sagawa |
| 2019/0164999 A1* | 5/2019 | Choi ................. G02F 1/136209 |

FOREIGN PATENT DOCUMENTS

| CN | 1498041 A | 5/2004 |
| CN | 101859794 A | 10/2010 |

(Continued)

*Primary Examiner* — Tong-Ho Kim
(74) *Attorney, Agent, or Firm* — ArentFox Schiff LLP; Michael Fainberg

(57) ABSTRACT

Embodiments of the present disclosure provide a display panel and a display device. The display panel includes a base substrate, a plurality of pixel units and a plurality of gate line groups. At least one pixel unit includes a plurality of sub-pixels. At least one sub-pixel includes a sensing transistor and a driving transistor. Each gate line group includes a first gate line and a second gate line; for the first gate line and the second gate line corresponding to the sub-pixels in the same row, the positions of the sensing transistors are closer to the second gate lines, and the positions of the driving transistors are closer to the first gate line, For two sub-pixels close to each other and located in different pixel units in the same row, at least one signal line has a double-layer alignment structure, and the double-layer alignments are electrically connected with each other.

49 Claims, 12 Drawing Sheets

(58) Field of Classification Search
CPC ......... G09G 3/3233; G09G 2300/0426; G09G 2300/0842; G09G 2320/0295
USPC .......................................................... 257/71
See application file for complete search history.

(56) References Cited

FOREIGN PATENT DOCUMENTS

| | | | |
|---|---|---|---|
| CN | 103715205 A | | 4/2014 |
| CN | 109841650 A | | 6/2019 |
| CN | 209434190 U | * | 9/2019 |
| CN | 209434190 U | | 9/2019 |
| KR | 20150060195 A | | 6/2015 |

* cited by examiner

DISPLAY PANEL AND DISPLAY DEVICE

The present application is a national stage application of International Application No. PCT/CN2019/122189, filed Nov. 29, 2019, which is hereby incorporated by reference in it entirety.

FIELD

The present disclosure relates to the technical field of display and in particular to a display panel and a display device.

BACKGROUND

An electroluminescent diode such as an organic light emitting diode (OLED) and a quantum dot light emitting diode (QLED) has the advantages such as self-illumination and low energy consumption so as to have become one of hot spots in the applied research fields of electroluminescent display panels nowadays and have been widely concerned.

SUMMARY

An embodiment of the present disclosure provides a display panel including:
a base substrate;
a plurality of pixel units, arranged on the base substrate in an array, where at least one of the pixel unit includes a plurality of sub-pixels, and at least one of the sub-pixels includes a sensing transistor and a driving transistor; and a plurality of gate line groups, each including a first gate line and a second gate line located at two sides of one respective row of the pixel units;
where in a same sub-pixel row, for a first gate line and the second gate line corresponding to the sub-pixels in the same row, sensing transistors are located at a side, closer to the second gate line, of the sub-pixels, and driving transistors are located at a side, closer to the first gate line, of the sub-pixels;
where in a same sub-pixel of the at least one sub-pixel, a first electrode of a sensing transistor is electrically connected with a second electrode of the driving transistor by a first connecting hole, and a first electrode of the driving transistor is electrically connected with a power line by a second connecting hole; and
where in the same sub-pixel, for two sub-pixels close to each other and located in different pixel units, at least one of signal lines in a region defined by the first connecting holes and the second connecting holes of the two sub-pixels has a double-layer alignment structure, and double-layer alignments of a double-layer alignment structure of a same signal line are electrically connected with each other.

Optionally, in the embodiment of the present disclosure, the at least one sub-pixel further includes: anodes, a light emitting functional layer and a cathode layer arranged in a stack, and where in the same sub-pixel of the at least one sub-pixel, a second electrode of the driving transistor is electrically connected with anodes;
the display panel further includes:
a plurality of auxiliary traces, where each auxiliary trace is located in a gap between two adjacent sub-pixel columns, and electrically connected with the cathode layer by a first via hole; and
a plurality of detection lines, where each detection line is located in a gap between two adjacent sub-pixel columns, insulated from the each auxiliary trace and electrically connected with a second electrode of the sensing transistor; and
where the signal lines include at least one of the auxiliary traces, the detection lines and the power lines.

Optionally, in the embodiment of the present disclosure, the display panel further includes:
a pixel defining layer, disposed between a layer on which the anodes are located and the light emitting functional layer;
a planarization layer, disposed on a side, facing the base substrate, of the pixel defining layer;
a first conducting layer, disposed on a side, facing the base substrate, of the planarization layer;
a first insulating layer, disposed on a side, facing the base substrate, of the first conducting layer; and
a second conducting layer, disposed on a the side, facing the base substrate, of the first insulating layer;
where the plurality of auxiliary traces including:
first auxiliary traces, located on the first conducting layer and extending in a column direction of the plurality of sub-pixels; and
second auxiliary traces, located on the second conducting layer; and
where the first auxiliary traces are electrically connected with the second auxiliary traces by second via holes penetrating through the first insulating layer.

Optionally, in the embodiment of the present disclosure, a second auxiliary trace includes a plurality of first auxiliary parts arranged at intervals, and where in a same auxiliary trace, a first auxiliary trace is electrically connected with corresponding first auxiliary parts by corresponding second via holes, respectively.

Optionally, in the embodiment of the present disclosure, in the same auxiliary trace, an orthographic projection of the first auxiliary trace on the base substrate is overlapped with orthographic projections of the corresponding first auxiliary parts on the base substrate.

Optionally, in the embodiment of the present disclosure, the orthographic projections of the plurality of first auxiliary parts on the base substrate cover orthographic projections of the corresponding second via holes on the base substrate.

Optionally, in the embodiment of the present disclosure, in a same first auxiliary trace: for a plurality of first auxiliary parts electrically connected to the same first auxiliary trace, one first auxiliary part corresponds to one sub-pixel row.

Optionally, in the embodiment of the present disclosure, in a same first auxiliary trace: for a plurality of first auxiliary parts electrically connected to the same first auxiliary trace, one first auxiliary part corresponds to a sub-pixel row, and the sub-pixel row is spaced from another sub-pixel row corresponding to another first auxiliary part by at least one sub-pixel row.

Optionally, in the embodiment of the present disclosure, each first auxiliary trace is electrically connected with each of corresponding first auxiliary parts by at least four second via holes.

Optionally, in the embodiment of the present disclosure, in a same sub-pixel row: for first auxiliary parts, a first gate line and a second gate line corresponding to the same sub-pixel row, the first auxiliary parts are closer to the second gate line.

Optionally, in the embodiment of the present disclosure, overlapping area between orthographic projections of first via holes on the base substrate and orthographic projections of the anodes on the base substrate is zero.

Optionally, in the embodiment of the present disclosure, the display panel further includes: a plurality of first connecting parts, located on a same layer with the anodes and insulated from the anodes;
where the first via holes include first sub-via holes penetrating through the pixel defining layer and second sub-via holes penetrating through the planarization layer; and
the cathode layer is electrically connected with the plurality of first connecting parts by first sub-via holes, and the first connecting parts are electrically connected with the plurality auxiliary traces by the second sub-via holes.

Optionally, in the embodiment of the present disclosure, at least a portion of overlapping area between orthographic projections of the first sub-via holes on the base substrate and orthographic projections of the second sub-via holes on the base substrate is zero.

Optionally, in the embodiment of the present disclosure, one of the plurality of auxiliary traces corresponds to a plurality of first via holes, and one of the plurality of first via holes corresponds to one sub-pixel row; and where in a same sub-pixel row, for first via holes, a first gate line and a second gate line corresponding to the same sub-pixel row, orthographic projections of first sub-via holes on the base substrate is overlapped with an orthographic projection of the second gate line on the base substrate; and orthographic projections of second sub-via holes on the base substrate are located between an orthographic projection of the first gate line on the base substrate and the orthographic projection of the second gate line on the base substrate.

Optionally, in the embodiment of the present disclosure, in the same sub-pixel row, for the second sub-via holes, second via holes and the second gate line corresponding to the same sub-pixel row, the orthographic projections of the second sub-via holes on the base substrate are located between the orthographic projection of the second gate line on the base substrate and an orthographic projection of all the second via holes on the base substrate as a whole.

Optionally, in the embodiment of the present disclosure, widths of parts, overlapped with orthographic projections of the plurality first auxiliary parts, of the first auxiliary traces in a row direction of the sub-pixels are first widths, and widths of parts, overlapped with the orthographic projections of the first gate lines, of the first auxiliary traces in the row direction of the sub-pixels are second widths; and where the first widths are greater than the second widths.

Optionally, in the embodiment of the present disclosure, the parts, having the second widths, of the first auxiliary traces are close to the second connecting holes.

Optionally, in the embodiment of the present disclosure, each first auxiliary trace is located in a gap between two adjacent pixel unit columns.

Optionally, in the embodiment of the present disclosure, at least two adjacent pixel unit columns are taken as a first column group,
one of first column groups corresponds to one first auxiliary trace, and
the one first auxiliary trace is located in a gap between two adjacent pixel unit columns in corresponding one first column group.

Optionally, in the embodiment of the present disclosure, the display panel further includes:
a second insulating layer, disposed on a side, facing the base substrate, of the second conducting layer;
an active semiconductor layer, disposed on a side, facing the base substrate, of the second insulating layer;
a third insulating layer, disposed on a side, facing the base substrate, of the active semiconductor layer; and
a light-shielding metal layer, disposed on a side, facing the base substrate, of the third insulating layer; where the light-shielding metal layer includes:
at least one light-shielding electrode, where one light-shielding electrode is located in one sub-pixel; and
in the one sub-pixel, an orthographic projection of the one light-shielding electrode on the base substrate at least covers an orthographic projection of a channel region of the driving transistor on the base substrate.

Optionally, in the embodiment of the present disclosure, the at least one of the sub-pixels further includes a storage capacitor, where:
a first electrode of the storage capacitor is electrically connected with a gate of the driving transistor,
a second electrode of the storage capacitor is electrically connected with the second electrode of the driving transistor; and
the second electrode of the storage capacitor is further electrically connected with the light-shielding electrodes by a third connecting hole.

Optionally, in the embodiment of the present disclosure, the detection lines include:
first detection traces, located on the first conducting layer and extending in the column direction of the sub-pixels; and
second detection traces, located on the second conducting layer; where
the first detection traces are electrically connected with the second detection traces by third via holes penetrating through the first insulating layer.

Optionally, in the embodiment of the present disclosure, a second detection trace includes a plurality of second auxiliary parts arranged at intervals, and
in a same detection trace, a first detection trace is electrically connected with corresponding second auxiliary parts by corresponding third via holes, respectively.

Optionally, in the embodiment of the present disclosure, in the same detection trace, an orthographic projection of the first detection trace on the base substrate is overlapped with orthographic projections of the corresponding second auxiliary parts on the base substrate.

Optionally, in the embodiment of the present disclosure, orthographic projections of the plurality second auxiliary parts on the base substrate cover orthographic projections of the corresponding third via holes on the base substrate.

Optionally, in the embodiment of the present disclosure, in a same first detection trace, for a plurality of second auxiliary parts electrically connected to the same first detection trace, one second auxiliary part corresponds to one sub-pixel row.

Optionally, in the embodiment of the present disclosure, in a same first detection trace, for a plurality of second auxiliary parts electrically connected to the same first detection trace, one second auxiliary part corresponds to a sub-pixel row, and the sub-pixel row is spaced from another sub-pixel row corresponding to another second auxiliary part by at least one sub-pixel row.

Optionally, in the embodiment of the present disclosure, one of the plurality of second auxiliary parts and one of the plurality of first auxiliary parts correspond to a same sub-pixel row.

Optionally, in the embodiment of the present disclosure, in a same sub-pixel row, for first auxiliary parts and a second auxiliary part corresponding to the sub-pixel row, second via holes of the first auxiliary parts are staggered with third via holes of the second auxiliary parts.

Optionally, in the embodiment of the present disclosure, each second auxiliary part is electrically connected with a corresponding first detection trace by at least three third via holes.

Optionally, in the embodiment of the present disclosure, in a same sub-pixel row, for second auxiliary parts, a first gate line and a second gate line corresponding to the same sub-pixel row, the second auxiliary parts are closer to the second gate line.

Optionally, in the embodiment of the present disclosure,
  widths of parts, overlapped with the orthographic projections of the plurality second auxiliary parts, of the first detection traces in a row direction of the sub-pixels are third widths, and
  widths of parts, overlapped with the orthographic projections of the first gate lines, of the first detection traces in the row direction of the sub-pixels are fourth widths; and where
  the third widths are greater than the fourth widths.

Optionally, in the embodiment of the present disclosure, the parts, having the fourth widths, of the first detection traces are close to the second connecting holes.

Optionally, in the embodiment of the present disclosure, in same gaps each of which is arranged between two pixel unit columns,
  for first detection traces and first auxiliary traces arranged in the same gaps, orthographic projections of first sub-via holes corresponding to the first auxiliary traces on the base substrate are overlapped with orthographic projections of the first detection traces on the base substrate.

Optionally, in the embodiment of the present disclosure, one first detection trace and one first auxiliary trace are both arranged in a same gap between two adjacent pixel unit columns.

Optionally, in the embodiment of the present disclosure, the power lines include:
  first power traces, located on the first conducting layer and extending in a column direction of the sub-pixels; and
  second power traces, located on the second conducting layer; where
  the first power traces are electrically connected with the second power traces by fourth via holes penetrating through the first insulating layer.

Optionally, in the embodiment of the present disclosure, the first power traces and the first auxiliary traces are spaced for at least one pixel unit column.

Optionally, in the embodiment of the present disclosure, a second power trace includes a plurality of third auxiliary parts arranged at intervals, and where:
  in a same power line, a first power trace is electrically connected with corresponding third auxiliary parts by corresponding fourth via holes, respectively.

Optionally, in the embodiment of the present disclosure, in the same power line, an orthographic projection of the first power trace on the base substrate is overlapped with orthographic projections of the corresponding third auxiliary parts on the base substrate.

Optionally, in the embodiment of the present disclosure, the orthographic projections of the plurality of third auxiliary parts on the base substrate cover orthographic projections of the corresponding fourth via holes on the base substrate.

Optionally, in the embodiment of the present disclosure, each third auxiliary part is electrically connected with the first power trace by at least four fourth via holes.

Optionally, in the embodiment of the present disclosure, in a same first power trace, for a plurality of third auxiliary parts electrically connected to the same first power trace, one third auxiliary part corresponds to one sub-pixel row.

Optionally, in the embodiment of the present disclosure, in a same first power trace, for a plurality of third auxiliary parts electrically connected to the same first power trace, one third auxiliary part corresponds to a sub-pixel row, and the sub-pixel row is spaced from another sub-pixel row corresponding to another third auxiliary parts by at least one sub-pixel row.

Optionally, in the embodiment of the present disclosure, one of the plurality of third auxiliary parts and one of the plurality of first auxiliary parts correspond to a same sub-pixel row.

Optionally, in the embodiment of the present disclosure, in a same sub-pixel row, for third auxiliary parts, a first gate line and a second gate line corresponding to the same sub-pixel row, the third auxiliary parts are closer to the second gate line.

Optionally, in the embodiment of the present disclosure,
  widths of parts, overlapped with orthographic projections of the plurality of third auxiliary parts, of the first power traces in a row direction of the sub-pixels are fifth widths, and
  widths of parts, overlapped with the orthographic projections of the first gate lines, of the first power traces in the row direction of the sub-pixels are sixth widths; and where
  the fifth widths are greater than the sixth widths.

Optionally, in the embodiment of the present disclosure, the parts, having the sixth widths, of the first power traces are close to the second connecting holes.

Optionally, in the embodiment of the present disclosure, in a same sub-pixel row, for first connecting holes and third auxiliary parts corresponding to the same sub-pixel row, one of the fourth via holes corresponding to the third auxiliary parts and the first connecting holes are arranged on a same straight line in a row direction of the same sub-pixel row.

An embodiment of the present disclosure further provides a display device including the above-mentioned display panel.

DETAILED DESCRIPTION OF THE EMBODIMENTS

Figure 1:
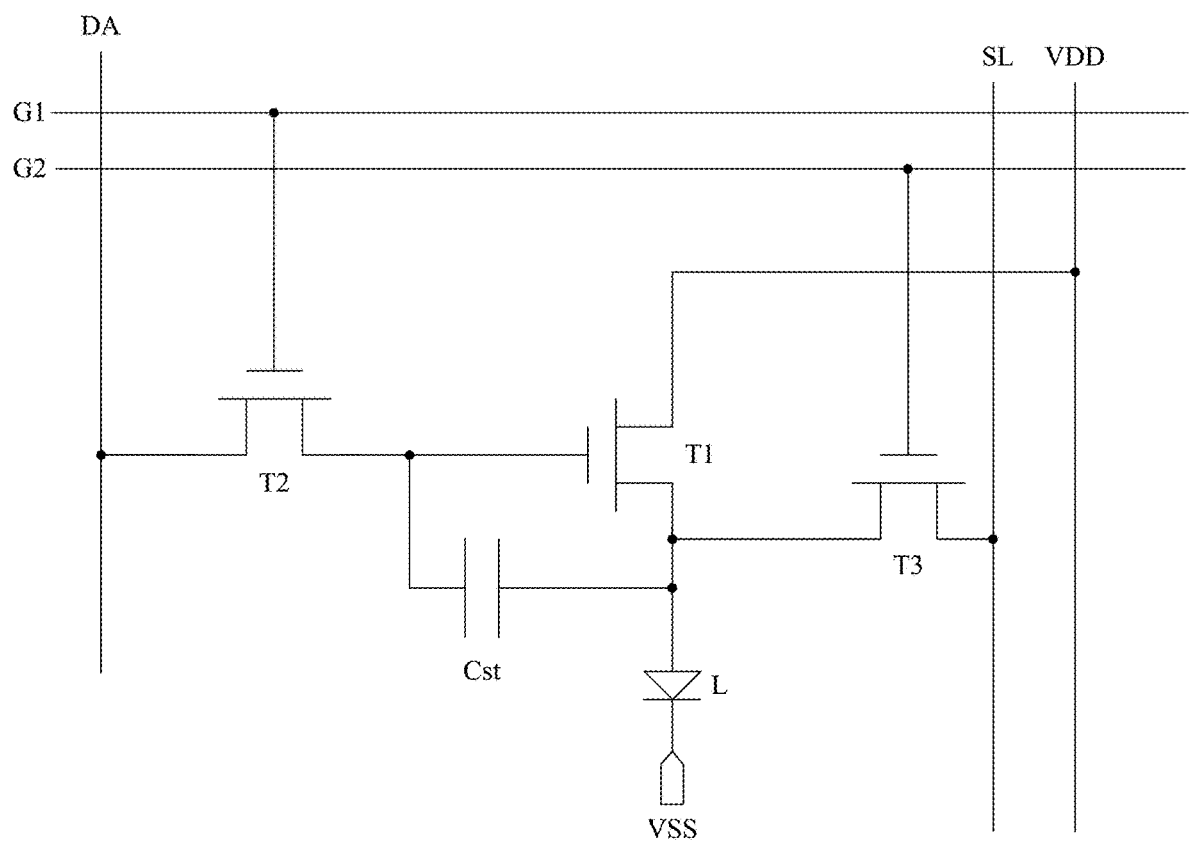
FIG. 1 is a structural schematic diagram of a pixel driving circuit provided by the embodiment of the present disclosure.

To make the objects, technical solutions and advantages of the embodiments of the present disclosure clearer, the technical solutions in the embodiments of the present disclosure will be described clearly and completely with reference to the accompanying drawings in the embodiments of the present disclosure. Obviously, the described embodiments are only a part of the embodiments of the present disclosure, and not all the embodiments. Moreover, the embodiments in the present disclosure and the features in the embodiments may be combined with each other without conflicts. Based on the described embodiments of the present disclosure, all other embodiments obtained by persons of ordinary skill in the art without creative efforts shall fall within the protection scope of the present disclosure.

Unless otherwise defined, technical or scientific terms used in the present disclosure shall have the ordinary meanings understood by persons of ordinary skill in the art to which the present disclosure pertains. The terms "first", "second" and the like used in present disclosure do not indicate any order, quantity or importance, but are only used to distinguish different components. Words such as "include" or "including" indicate that an element or item appearing before such a word covers listed elements or items appearing after the word and equivalents thereof, and does not exclude other elements or items. Words such as "connection" or "connected" are not limited to physical or mechanical connections, but may include electrical connections, whether direct or indirect.

It should be noted that sizes and shapes in the accompanying drawings do not reflect the true scale, and are merely intended to schematically illustrate the present disclosure. Furthermore, same or similar numerals throughout represent same or similar elements, or elements with same or similar functions.

An electroluminescent diode is generally current-driven and needs to be driven by a stable current to emit light, and is driven to emit light by a pixel driving circuit adopted in a display panel. The electroluminescent diode includes anodes, a light emitting functional layer and a cathode layer which are sequentially stacked on a base substrate. The pixel driving circuit electrically connected with the anodes so as to load signals to the anodes. Moreover, a low-voltage signal VSS is loaded on the cathode layer to make the electroluminescent diode emit light. However, during actual application, a light emitting surface of a top-emitting electroluminescent diode is located at the side of the cathode layer, in order to increase the transmittance of a cathode, the cathode is generally made of a transparent conductive material or made to be very thin, thereby resulting in relatively high square resistance of the cathode. In this way, when the display panel works, a current flowing through the cathode may be relatively high, and an internal resistance voltage drop (IR-Drop) on the cathode is relatively high, thereby resulting in the problem of non-uniformity of light emitting brightness on different positions of the display panel.

A display panel provided by an embodiment of the present disclosure may include a base substrate, a plurality of pixel units arranged on the base substrate in the form of array, and a plurality of gate line groups. At least one of the pixel units includes a plurality of sub-pixels, and at least one of the sub-pixels includes a sensing transistor and a driving transistor. The gate line groups each include a first gate line and a second gate line located at two sides of the pixel unit. For the first gate line and the second gate line corresponding to the sub-pixels in the same row, the sensing transistors are located at the sides, closer to the second gate line, of the sub-pixels, and the driving transistors are located at the sides, closer to the first gate line, of the sub-pixels. In the same sub-pixel, a first electrode of the sensing transistor is electrically connected with a second electrode of the driving transistor by a first connecting hole, and a first electrode of the driving transistor is electrically connected with a power line by a second connecting hole. For two sub-pixels close to each other in the same row and not located in the same pixel unit, at least one signal line in a region defined by the first connecting holes and the second connecting holes of the two sub-pixels has a double-layer alignment structure, and the double-layer alignments of the double-layer alignment structure of the same signal line are electrically connected with each other. In this way, due to the arrangement of the double-layer alignments electrically connected with each other, the resistances of the signal lines provided with the double-layer alignment structures may be reduced, so that influences of IR Drop on the light emitting uniformity of the display panel can be reduced, and the display effect of the display panel can be improved.

In some embodiments, at least one of the sub-pixels may include a pixel driving circuit and an electroluminescent diode L. The display panel provided by the embodiment of the present disclosure is described below in combination with the structure of the pixel driving circuit.

As shown in FIG. 1, the pixel driving circuit generally includes a driving transistor T1, a switching transistor T2, a sensing transistor T3 and a storage capacitor Cst. A gate of the switching transistor T2 is electrically connected with a first gate line G1, a first electrode (such as a source) of the switching transistor T2 is electrically connected with a data line DA, and a second electrode (such as a drain) of the switching transistor T2 is electrically connected with a gate of the driving transistor T1. A first electrode (such as a source) of the driving transistor T1 is electrically connected with a power line VDD, a second electrode (such as a drain) of the driving transistor T1 is electrically connected with the anode of the electroluminescent diode L, and the cathode of the electroluminescent diode L is electrically connected with the low-voltage signal line VSS. A gate of the sensing transistor T3 is electrically connected with a second gate line G2, a first electrode (such as a source) of the sensing transistor T3 is electrically connected with the second electrode (such as the drain) of the driving transistor T1, and a second electrode (such as a drain) of the sensing transistor T3 is electrically connected with a detection line SL. A first electrode of the storage capacitor Cst is electrically connected with the gate of the driving transistor T1, and a second electrode of the storage capacitor Cst is electrically connected with the second electrode (such as the drain) of the driving transistor T1.

The switching transistor T2 is controlled to be turned on by a signal transmitted on the first gate line G1, so that a data voltage transmitted on the data line DA is written into the gate of the driving transistor T1, the driving transistor T1 is controlled to generate a working current to drive the electroluminescent diode L to emit light. The sensing transistor T3 is controlled to be turned on by a signal transmitted on the second gate line G2, so that the working current generated by the driving transistor T1 is output to the detection line SL to charge the detection line SL. Then, voltages on all detection lines SL are detected, and compensation calculation is performed according to the detected voltages, and thus, the data voltage which is used for display and corresponds to the sub-pixels of the row is obtained.

In some embodiments, the power line VDD is capable of transmitting a constant first voltage which is a positive voltage; and the low-voltage signal line VSS is capable of transmitting a constant second voltage which is a negative voltage. Or, in some embodiments, the low-voltage signal line VSS may be grounded.

It should be noted that, in the embodiment of the present disclosure, the pixel driving circuit may also be of a structure including other number of transistors and capacitors in addition to the structure shown in FIG. 1, the limitations thereof are omitted in the embodiment of the present disclosure.

Figure 2A:
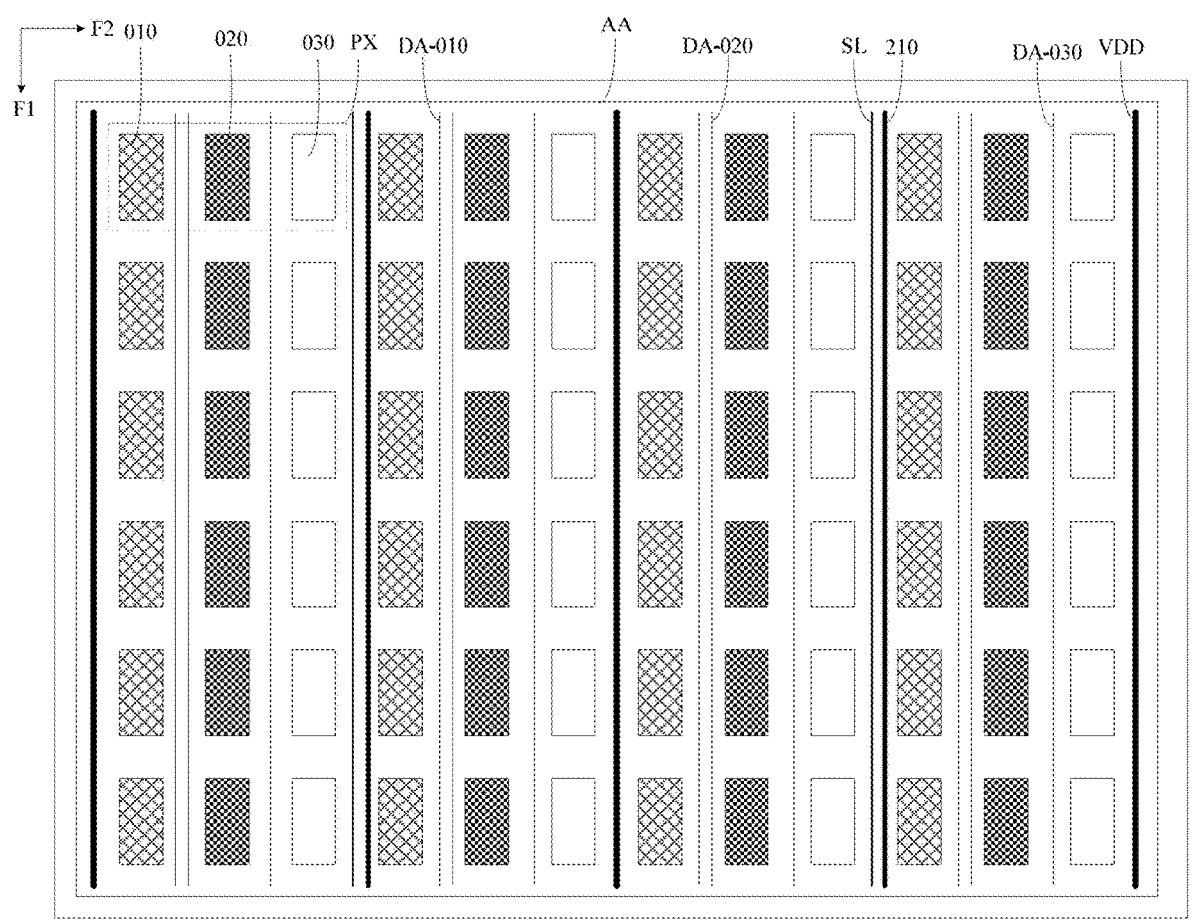
FIG. 2a is a top-viewed structural schematic diagram of a display panel provided by an embodiment of the present disclosure.
Figure 2B:
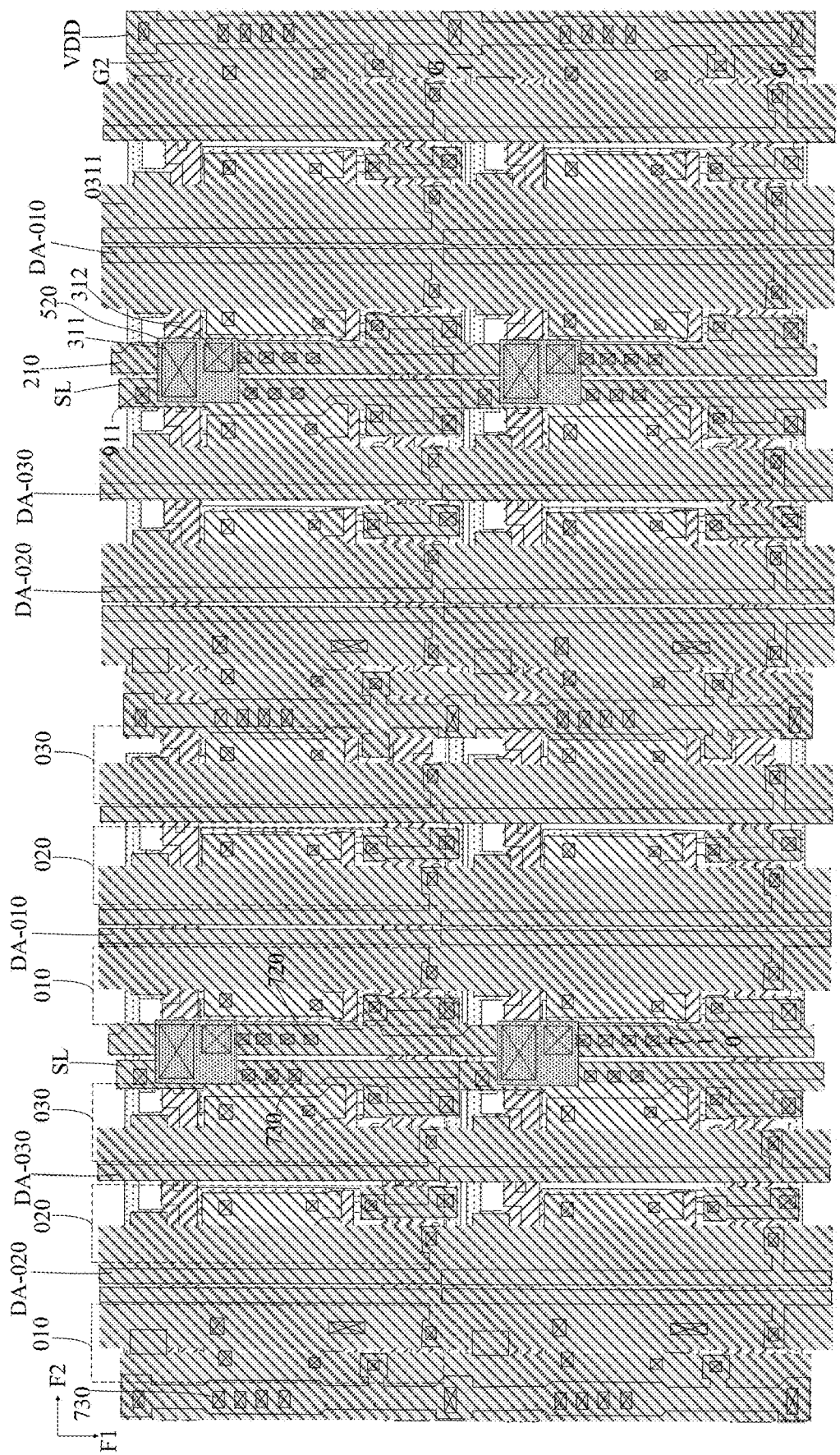
FIG. 2b is a top-viewed structural schematic diagram of some display panels provided by an embodiment of the present disclosure.

As shown in FIG. 2a and FIG. 2b, the display panel may include multiple pixel units PX located in a display region AA, such as a plurality of pixel units PX. At least one of the pixel units PX may include multiple sub-pixels. For example, each of the pixel units may include multiple sub-pixels. Generally, in the display field, one pixel unit usually includes multiple sub-pixels capable of respectively displaying single color (such as red, green or blue), and one electroluminescent diode and one pixel driving circuit are arranged in each sub-pixel to display different colors by controlling the light emitting proportions of the sub-pixels with different colors, so that the above-mentioned multiple sub-pixels included in one pixel unit, may be single-color sub-pixels.

In some embodiments, as shown in FIG. 2a and FIG. 2b, the pixel unit PX may include a first-color sub-pixel 010, a second-color sub-pixel 020 and a third-color sub-pixel 030. The first-color sub-pixel is configured to emit light with a first color, the second-color sub-pixel is configured to emit light with a second color, and the third-color sub-pixel is configured to emit light with a third color. In some examples, the first, second and third colors may be selected from red, green and blue. For example, the first color is red, the second color is green, and the third color is blue. Therefore, the pixel unit PX is of an arrangement structure of red, green and blue sub-pixels. Of course, the embodiment of the present disclosure includes, but is not limited to these colors, and the above-mentioned first, second and third colors may also be other colors.

In some embodiments, the first-color sub-pixels, the second-color sub-pixels and the third-color sub-pixels are sequentially arranged in a row direction including a row direction F2 of which an arrow indicates from the left to right, and the sub-pixels in the same column are same in color. Of course, the embodiment of the present disclosure includes, but is not limited to this.

In some embodiments, as shown in FIG. 2a and FIG. 2b, the display panel further includes a plurality of auxiliary traces 210, a plurality of detection lines SL, a plurality of data lines DA (DA-010, DA-020 and DA-030) and power lines VDD. The detection lines are insulated from the auxiliary traces, and the auxiliary traces 210 are located in gaps between two adjacent sub-pixel columns. The detection lines SL are located in gaps between two adjacent sub-pixel columns and are electrically connected with the second electrodes of the sensing transistors. The first electrodes of the driving transistors are electrically connected with the power lines VDD.

All layers of the pixel driving circuit provided by some embodiments of the present disclosure are described below with the first-color sub-pixel 010, the second-color sub-pixel 020 and the third-color sub-pixel 030 in the same pixel unit as examples. As shown in FIG. 3 to FIG. 5d, FIG. 5a to FIG. 5d are schematic diagrams of all layers of the pixel driving circuit provided by some embodiments of the present disclosure. Positional relationships of the pixel driving circuit on a base substrate will be described below in combination with FIG. 5a to FIG. 5d.

As shown in FIG. 3 to FIG. 5d, the display panel may include a pixel defining layer 330 located between a layer 500 on which anodes are located and a light emitting functional layer 600, a planarization layer 320 located at the side, facing the base substrate 100, of the pixel defining layer 330, a first conducting layer 200 located at the side, facing the base substrate, of the planarization layer 320, a first insulating layer 711 located at the side, facing the base substrate 100, of the first conducting layer 200, a second conducting layer 800 located at the side, facing the base substrate 100, of the first insulating layer 711, a second insulating layer 712 located at the side, facing the base substrate 100, of the second conducting layer 800, an active semiconductor layer 0320 located at the side, facing the base substrate 100, of the second insulating layer 712, a third insulating layer 713 located at the side, facing the base substrate 100, of the active semiconductor layer 0320, and a light-shielding metal layer 0310 located at the side, facing the base substrate 100, of the third insulating layer 713.

FIG. 3 to FIG. 5d further show the first gate line G1, the second gate line G2, the detection line SL, the data lines DA-010, DA-020 and DA-030, the power line VDD and the auxiliary trace 210 which are connected to the pixel driving circuit. The data line DA-010 is electrically connected with the switching transistor T2 of the pixel driving circuit in the first-color sub-pixel 010, the data line DA-020 is electrically connected with the switching transistor T2 of the pixel driving circuit in the second-color sub-pixel 020, and the data line DA-030 is electrically connected with the switching transistor T2 of the pixel driving circuit in the third-color sub-pixel 030.

Figure 3:
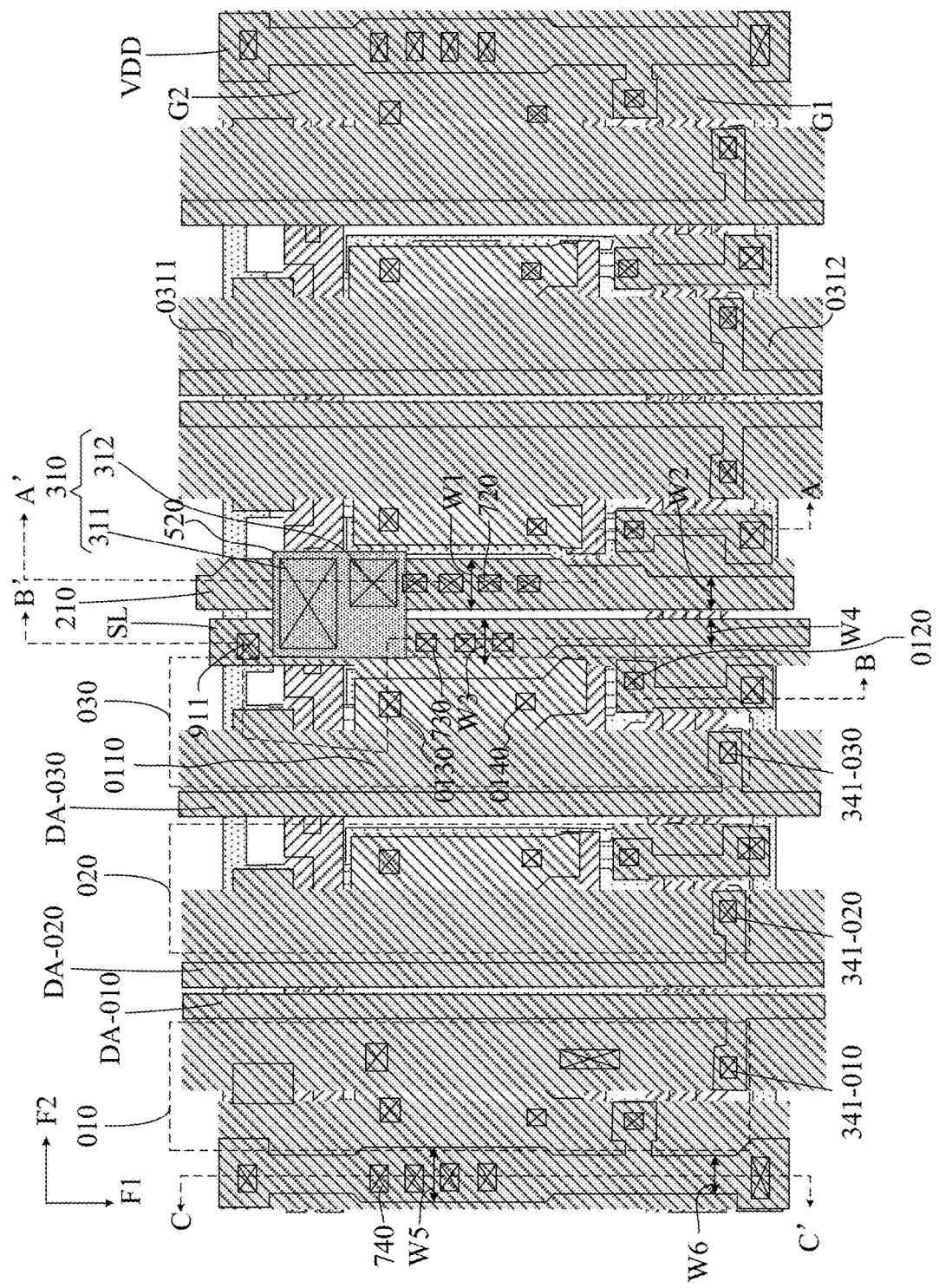
FIG. 3 is a layout structural schematic diagram of some another display panels provided by an embodiment of the present disclosure.
Figure 5A:
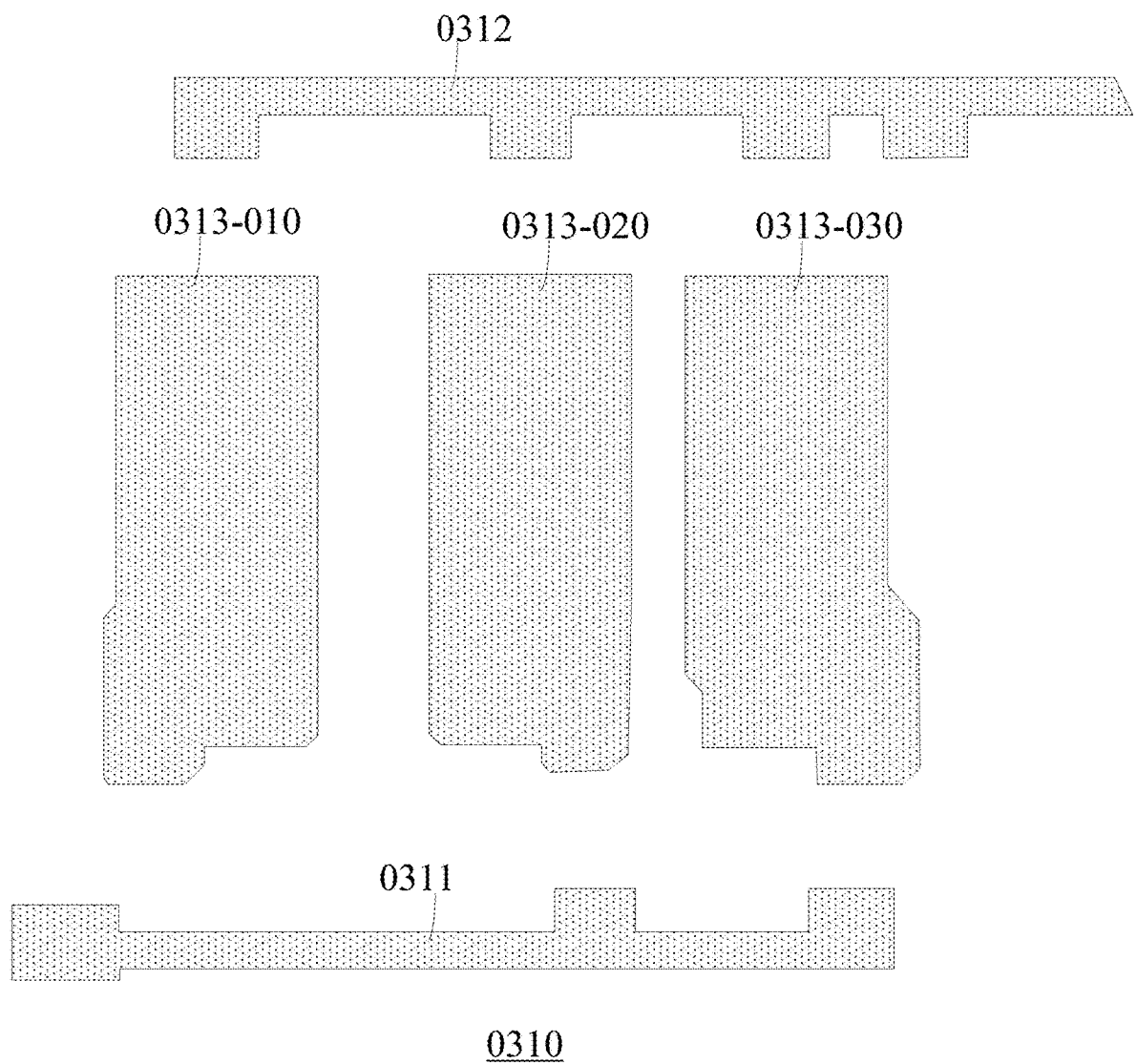
FIG. 5a is a structural schematic diagram of a light-shielding metal layer in the display panels as shown in FIG. 3.

In some embodiments, the light-shielding metal layer 0310 of the pixel driving circuit is shown in combination with FIG. 3 and FIG. 5a and is located on the base substrate 100. The light-shielding metal layer 0310 includes a first connecting trace 0311, a second connecting trace 0312 and light-shielding electrodes 0313-010, 0313-020 and 0313-030. The first connecting trace 0311 and the second connecting trace 0312 extend in the row direction. The first-color sub-pixel 010 includes the light-shielding electrode 0313-010, the second-color sub-pixel 020 includes the light-shielding electrode 0313-020, and the third-color sub-pixel 030 includes the light-shielding electrode 0313-030. Orthographic projections of the light-shielding electrodes 0313-010, 0313-020 and 0313-030 on the base substrate 100 at least cover orthographic projections of channel regions of the driving transistor on the base substrate 100.

Figure 5B:
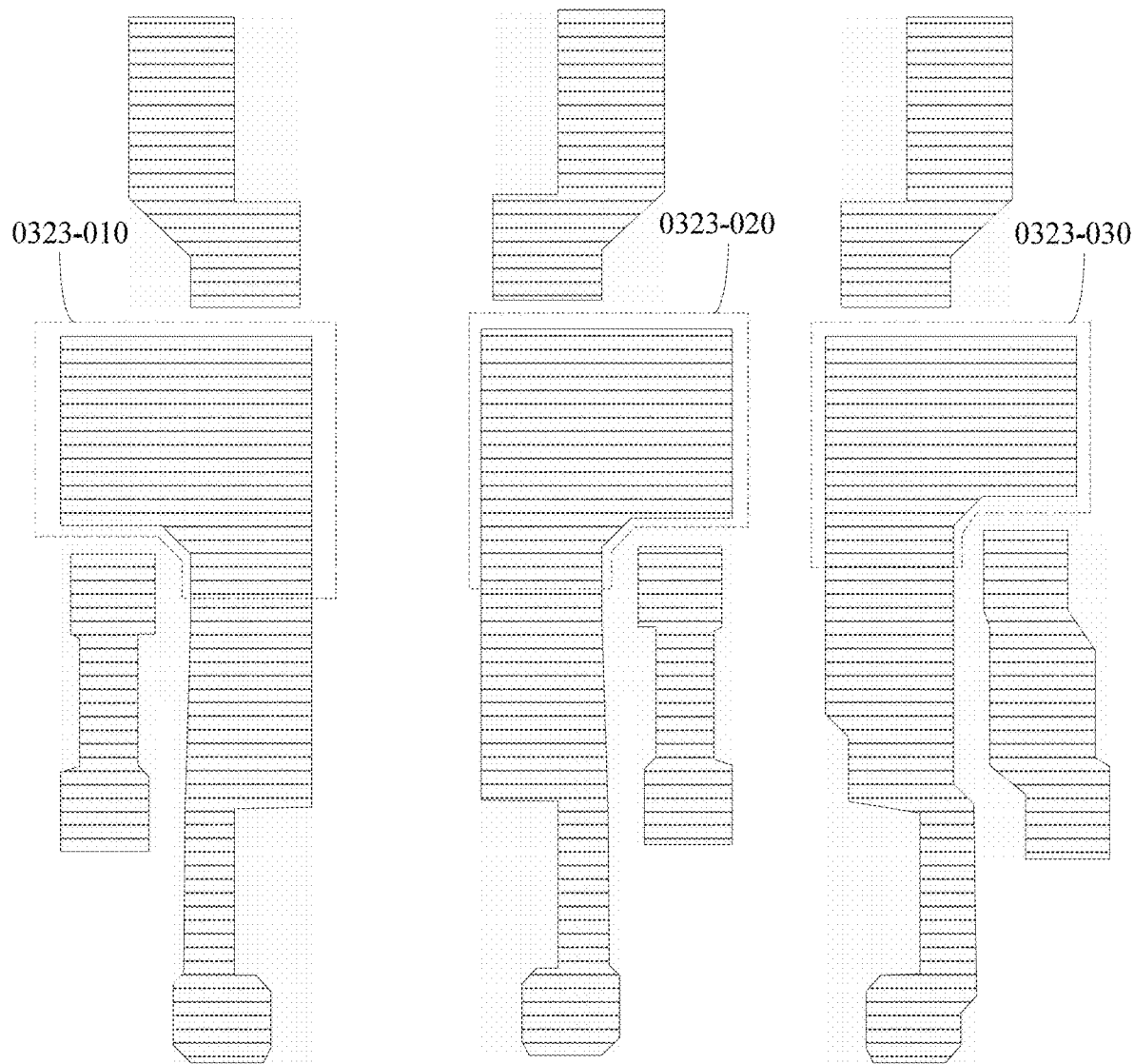
FIG. 5b is a structural schematic diagram of an active semiconductor layer in the display panels as shown in FIG. 3.

In some embodiments, the active semiconductor layer 0320 of the above-mentioned pixel driving circuit is shown in combination with FIG. 3 and FIG. 5b, and the third insulating layer 713 is arranged between the active semiconductor layer 0320 and the light-shielding metal layer 0310. The active semiconductor layer 0320 may be formed by patterning a semiconductor material. The active semiconductor layer 0320 may be used for fabricating active layers of the driving transistors T1, the switching transistors T2 and the sensing transistors T3 in the first-color sub-pixel 010, the second-color sub-pixel 020 and the third-color sub-pixel 030, and each of the active layers may include a source region, a drain region and a channel region between the source region and the drain region. Moreover, the active semiconductor layer 0320 further includes conducting regions 0323-010, 0323-020 and 0323-030, wherein the conducting region 0323-010 forms a first electrode of a storage capacitor Cst in the first-color sub-pixel 010, the conducting region 0323-020 forms a first electrode of a storage capacitor Cst in the second-color sub-pixel 020, and the conducting region 0323-030 forms a first electrode of a storage capacitor Cst in the third-color sub-pixel 030. Of course, the embodiment of the present disclosure includes, but is not limited to this.

Further, the active layers of all the transistors are arranged at intervals. In some embodiments, the active semiconductor layer 0320 may be made of amorphous silicon, polysilicon, an oxide semiconductor material and the like. It should be noted that the above-mentioned source region and drain region of the active layer may be regions in which n-type or p-type impurities are doped. The above-mentioned conducting regions of the active semiconductor layer 0320 may be regions with conductive properties formed after the active semiconductor layer 0320 is subjected to ion doping. Of course, the embodiment of the present disclosure includes, but is not limited to this.

In some embodiments, the pixel driving circuit further includes the second conducting layer 800 located at the side, facing away from the base substrate 100, of the active semiconductor layer 0320. The second insulating layer 712 is formed between the active semiconductor layer 0320 and the second conducting layer 800 and is used for protecting the active semiconductor layer 0320. The second conducting layer 800 is shown in combination with FIG. 3 and FIG. 5c. The second conducting layer 800 is arranged on the second insulating layer 712 so as to be insulated from the active semiconductor layer 0320. The second conducting layer 800 may include a plurality of first gate lines G1, a plurality of second gate lines G2 and a plurality of gate parts (such as gate parts G-010, G-020 and G-030). In some embodiments, as shown in combination with FIG. 3 and FIG. 5c, the gate of the switching transistor T2 may be a part, overlapped with the active semiconductor layer 0320, of the first gate line G1, and the gate of the sensing transistor T3 may be a part, overlapped with the active semiconductor layer 0320, of the second gate line G2. The gate part G-010 is the gate of the driving transistor T1 in the first-color sub-pixel 010, the gate part G-020 is the gate of the driving transistor T1 in the second-color sub-pixel 020, and the gate part G-030 is the gate of the driving transistor T1 in the third-color sub-pixel 030.

Further, in some embodiments, each gate line group includes a first gate line G1 and a second gate line G2, wherein one row of sub-pixels corresponds to one gate line group, and the first gate line G1 and the second gate line G2 in the same gate line group are located at two sides of the pixel units in the row. For example, as shown in FIG. 2b and FIG. 3, one row of sub-pixels is correspondingly and electrically connected with one first gate line G1 and one second gate line G2. Moreover, the first gate line G1 and the second gate line G2 are arranged in a column direction F1 and extend in the row direction. For example, in the column direction F1, the first electrode of the storage capacitor Cst (0323-010, 0323-020, 0323-030) is located between the first gate line G1 and the second gate line G2.

Figure 5C:
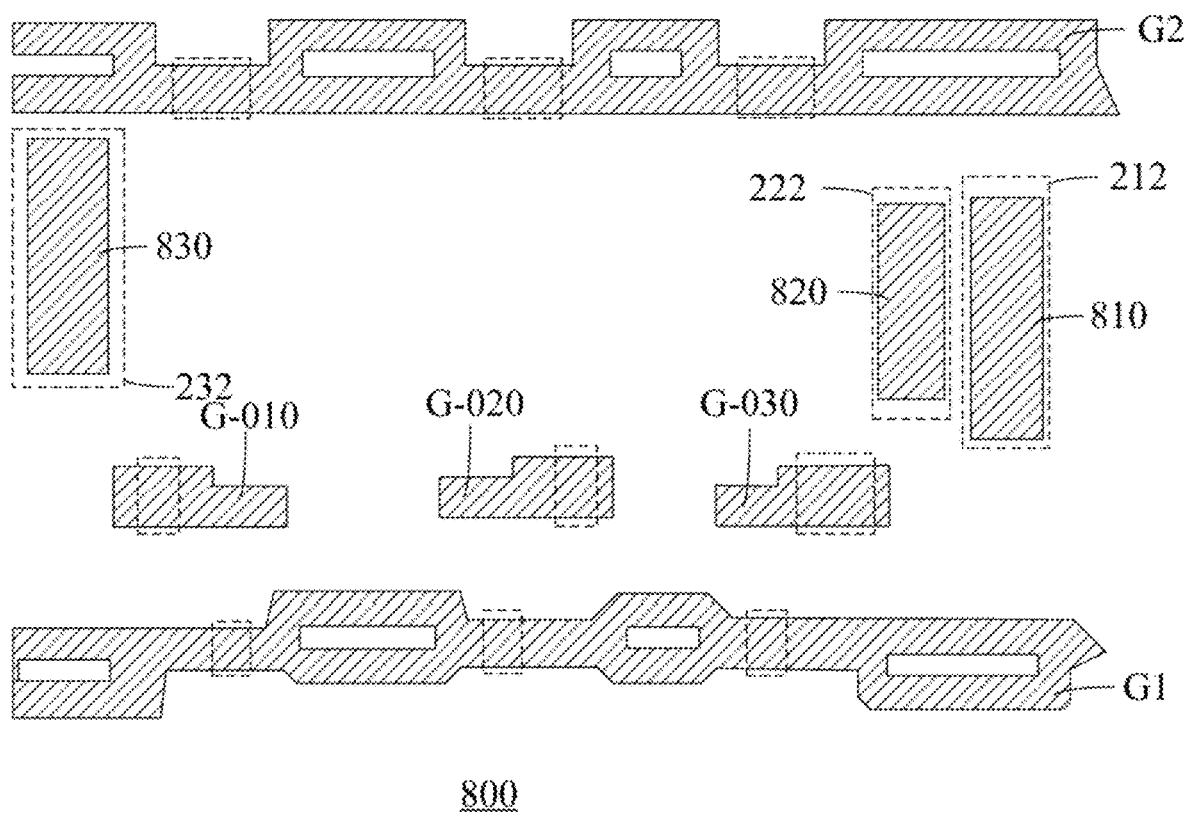
FIG. 5c is a structural schematic diagram of a second conducting layer in the display panels as shown in FIG. 3.

It should be noted that dotted rectangular boxes (unmarked) in FIG. 5c show parts, overlapped with the active semiconductor layer 0320, of the second conducting layer 800.

In some embodiments, the side, facing away from the base substrate 100, of the second conducting layer 800 is provided with the first insulating layer 711 used for protecting the second conducting layer 800. The first conducting layer 200 of the pixel driving circuit is shown in combination with FIG. 3 and FIG. 5d, and the first conducting layer 200 is located at the side, facing away from the base substrate 100, of the first insulating layer 711. The first conducting layer 200 includes a plurality of data lines (such as data lines DA-010, DA-020 and DA-030) and capacitor electrode parts Cst-010, Cst-020 and Cst-030. The capacitor electrode part Cst-010 is used as a second electrode of the storage capacitor Cst in the first-color sub-pixel 010, the capacitor electrode part Cst-020 is used as a second electrode of the storage capacitor Cst in the second-color sub-pixel 020, and the capacitor electrode part Cst-030 is used as a second electrode of the storage capacitor Cst in the third-color sub-pixel 030.

In some embodiments, the data lines DA-010, DA-020 and DA-030 may extend in the column direction F1 and may be arranged in the row direction. Moreover, the data lines DA-010, DA-020 and DA-030 are electrically connected with the sources of the switching transistors by respective parts protruding in the row direction.

Figure 4A:
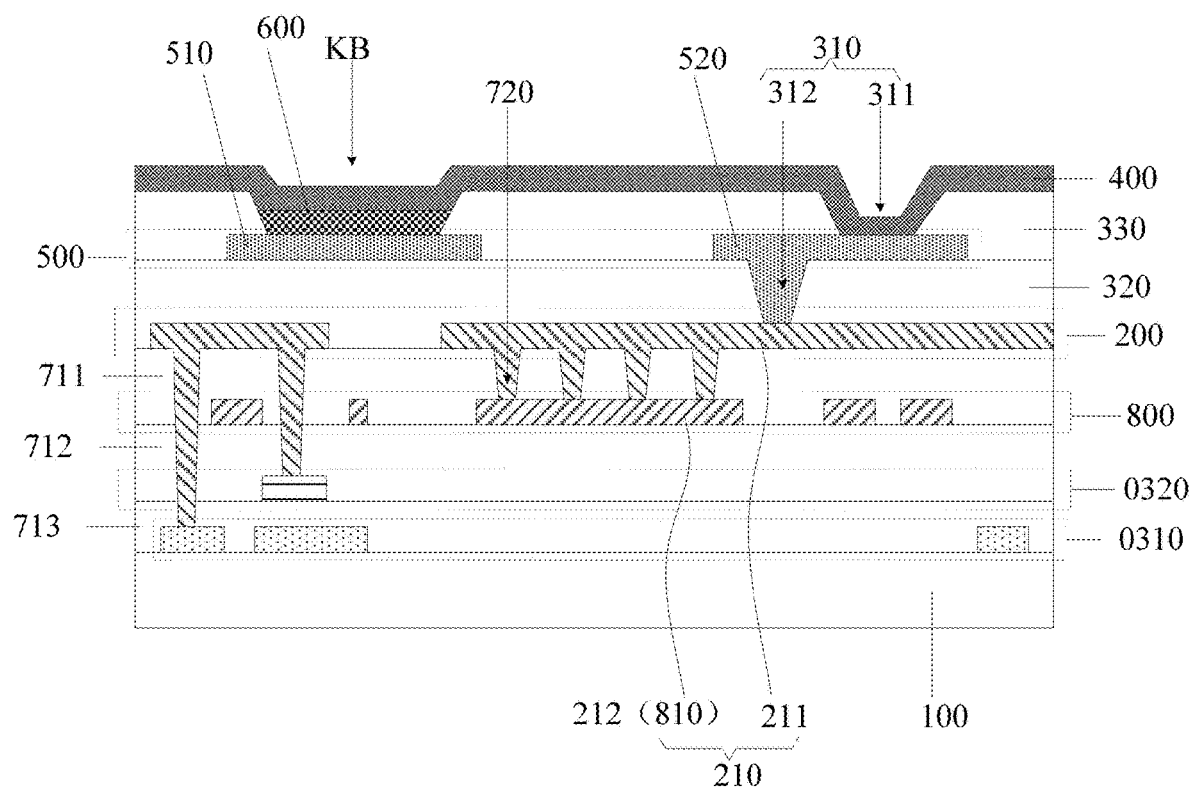
FIG. 4a is a sectional structural schematic diagram of the display panels as shown in FIG. 3 in a direction AA'.

In some embodiments, as shown in FIG. 3 and FIG. 4a, the pixel defining layer 330 may include a plurality of light emitting opening regions KB. Moreover, the display panel may further include a layer 500 on which the anodes are located and which is located between the planarization layer 320 and the pixel defining layer 330, a cathode layer 400, and a light emitting functional layer 600 located between the layer 500 on which the anodes are located and the cathode layer 400. Moreover, the layer 500 on which the anodes are located includes a plurality of anodes 510 independent from each other, wherein one of the anodes 510 corresponds to one of the light emitting opening regions KB, and orthographic projections of the anodes 510 on the base substrate 100 are overlapped with orthographic projections of the corresponding light emitting opening regions KB on the base substrate 100. In some embodiments, orthographic projections of the anodes 510 on the base substrate 100 are not overlapped with orthographic projections of first via holes 310 on the base substrate 100. In this way, the flatness of the anodes 510 may be avoided from being affected by the first via holes 310.

The side, facing away from the base substrate 100, of the first conducting layer 200 is provided with the planarization layer 320 used for protecting the first conducting layer 200 and achieving a planarization effect. The side, facing away from the base substrate 100, of the layer 500 on which the anodes are located is provided with the pixel defining layer 330, the pixel defining layer 330 is provided with the plurality of light emitting opening regions KB, one of the anodes 510 corresponds to one of the light emitting opening regions KB, so that the anodes 510 are exposed by virtue of the corresponding light emitting opening regions KB. In other words, the first conducting layer 200 is located at the side, facing the base substrate 100, of the layer 500 on which the anodes are located. In this way, the light transmittance may not be affected by the first conducting layer 200, so that the first conducting layer 200 may not be affected by width and thickness, the resistance of the cathode layer 400 may be reduced by arranging the first conducting layer 200 even if the cathode layer 400 is made of a transparent conductive material or made to be very thin, furthermore, influences of IR Drop on the light emitting uniformity of the display panel can be reduced, and the display effect of the display panel can be improved.

In some embodiments, in the top-emitting electroluminescent diode, the anodes 510 may be reflecting anodes so as to reflect light. Moreover, the light emitting functional layer 600 is in direct contact with the anodes 510 by the light emitting opening regions KB and is in direct contact with the cathode layer 400 so as to be driven to emit light by virtue of signals loaded on the anodes 510 and the signal loaded on the cathode layer 400. Of course, the present disclosure includes, but is not limited to this. For example, a hole transport layer and a hole injection layer may also be arranged between the light emitting functional layer 600 and the anodes 510, and film layers such as an electron transport layer and an electron injection layer may also be arranged between the light emitting functional layer 600 and the cathode layer 400.

In some embodiments, the cathode layer 400 is generally of a whole-layer structure and overlays the base substrate 100. In other words, the anodes 510, the light emitting functional layer 600 and the cathode layer 400 are stacked to form the electroluminescent diode. Further, the orthographic projections of the anodes 510 on the base substrate 100 may be enabled to cover the orthographic projections of the corresponding light emitting opening regions KB on the base substrate 100. Moreover, the area of the orthographic projections of the anodes 510 on the base substrate 100 is greater than that of the orthographic projections of the corresponding light emitting opening regions KB on the base substrate 100. In other words, there is a certain distance from the edges of the orthographic projections of the anodes 510 on the base substrate 100 to the edges of the orthographic projections of the corresponding light emitting opening regions KB on the base substrate 100, and the distance may be designed and determined according to an actual application environment, but is not limited herein.

FIG. 3 is a schematic diagram of stacking positional relationships among the light-shielding metal layer 0310, the active semiconductor layer 0320, the second conducting layer 800 and the first conducting layer 200. As shown in combination with FIG. 3 to FIG. 5d, a part, protruding in the row direction, of the data line DA-010 is electrically connected with the source region of the switching transistor T2 of the first-color sub-pixel 010 in the active semiconductor layer 0320 by at least one via hole (such as a via hole 341-010) penetrating through the first insulating layer 711 and the second insulating layer 712. A part, protruding in the row direction, of the data line DA-020 is electrically connected with the source region of the switching transistor T2 of the second-color sub-pixel 020 in the active semiconductor layer 0320 by at least one via hole (such as a via hole 341-020) penetrating through the first insulating layer 711 and the second insulating layer 712. A part, protruding in the row direction, of the data line DA-030 is electrically connected with the source region of the switching transistor T2 of the third-color sub-pixel 030 in the active semiconductor layer 0320 by at least one via hole (such as a via hole 341-030) penetrating through the first insulating layer 711 and the second insulating layer 712. Of course, the present disclosure includes, but is not limited to this.

In combination with part of figures in FIG. 3 to FIG. 5d, in each of the sub-pixels, the first electrode of the sensing transistor T3 is electrically connected with the second electrode of the driving transistor T1 by a first connecting hole 0110. In some embodiments, as shown in FIG. 3 and FIG. 4b, the source region of the sensing transistor T3 in the active semiconductor layer 0320 is electrically connected with the first electrode of the storage capacitor Cst by the first connecting hole 0110 penetrating through the first insulating layer 711 and the second insulating layer 712. The drain region of the driving transistor T1 in the active semiconductor layer 0320 is electrically connected with the first electrode of the storage capacitor Cst by a fourth connecting hole 0140 penetrating through the first insulating layer 711 and the second insulating layer 712. In this way, the first electrode of the sensing transistor T3 may be electrically connected with the second electrode of the driving transistor T1.

Moreover, in combination with part of figures in FIG. 3 to FIG. 5d, in each of the sub-pixels, the first electrode of the driving transistor T1 is electrically connected with the power line VDD by a second connecting hole 0120. For example, as shown in FIG. 3 and FIG. 4b, the first conducting layer 200 may further include a plurality of fourth connecting parts, and part of the sub-pixels are each internally provided with a fourth connecting part. For example, the second-color sub-pixel 020 is internally provided with a fourth connecting part T1-020, and the third-color sub-pixel 030 is internally provided with a fourth connecting part T1-030. One end of the fourth connecting part T1-030 is electrically connected with the corresponding second connecting trace 0312 by a via hole 917 penetrating through the first insulating layer 711, the second insulating layer 712 and the third insulating layer 713, and the other end of the fourth connecting part T1-030 is electrically connected with the source region of the active layer of the driving transistor T1 by a second connecting hole 0120 penetrating through the first insulating layer 711 and the second insulating layer 712. The fourth connecting part T1-020 of the second-color sub-pixel 020 is arranged in a similar way, the descriptions thereof are omitted herein.

Moreover, the second electrode of the storage capacitor is further electrically connected with the light-shielding electrodes by third connecting holes. In some embodiments, in combination with part of figures in FIG. 3 to FIG. 5d, the capacitor electrode part Cst-030 is electrically connected with the light-shielding electrode 0313-030 by a third connecting hole 0130 penetrating through the first insulating layer 711, the second insulating layer 712 and the third insulating layer 713, so that the capacitance value of the storage capacitor is increased. The capacitor electrode part Cst-010 and the capacitor electrode part Cst-020 are arranged in a similar way, the descriptions thereof are omitted herein. Further, in the same sub-pixel, an orthographic projection of the light-shielding electrode on the base substrate 100 can cover the region defined by first connecting via holes and second connecting via holes.

In some embodiments, as shown in FIG. 3 and FIG. 4a, the cathode layer 400 is electrically connected with the auxiliary trace 210 by the first via holes 310. In some embodiments, the signal lines with the double-layer alignment structures may include the auxiliary traces 210. In this way, due to the arrangement of the auxiliary traces 210 and the electrical connection between the cathode layer 400 and the auxiliary traces 210, the resistance of the cathode layer is reduced, so that influences of IR Drop on the light emitting uniformity of the display panel can be reduced, and the display effect of the display panel can be improved.

In some embodiments, as shown in FIG. 2a, FIG. 3, FIG. 4a and FIG. 5d, the auxiliary traces 210 may include first auxiliary traces 211 located on the first conducting layer 200 and second auxiliary traces 212 located on the second conducting layer 800. The first auxiliary traces 211 extend in the column direction F1 of the sub-pixels and are arranged in the row direction of the sub-pixels. Of course, the embodiment of the present disclosure includes, but is not limited to this.

Figure 5D:
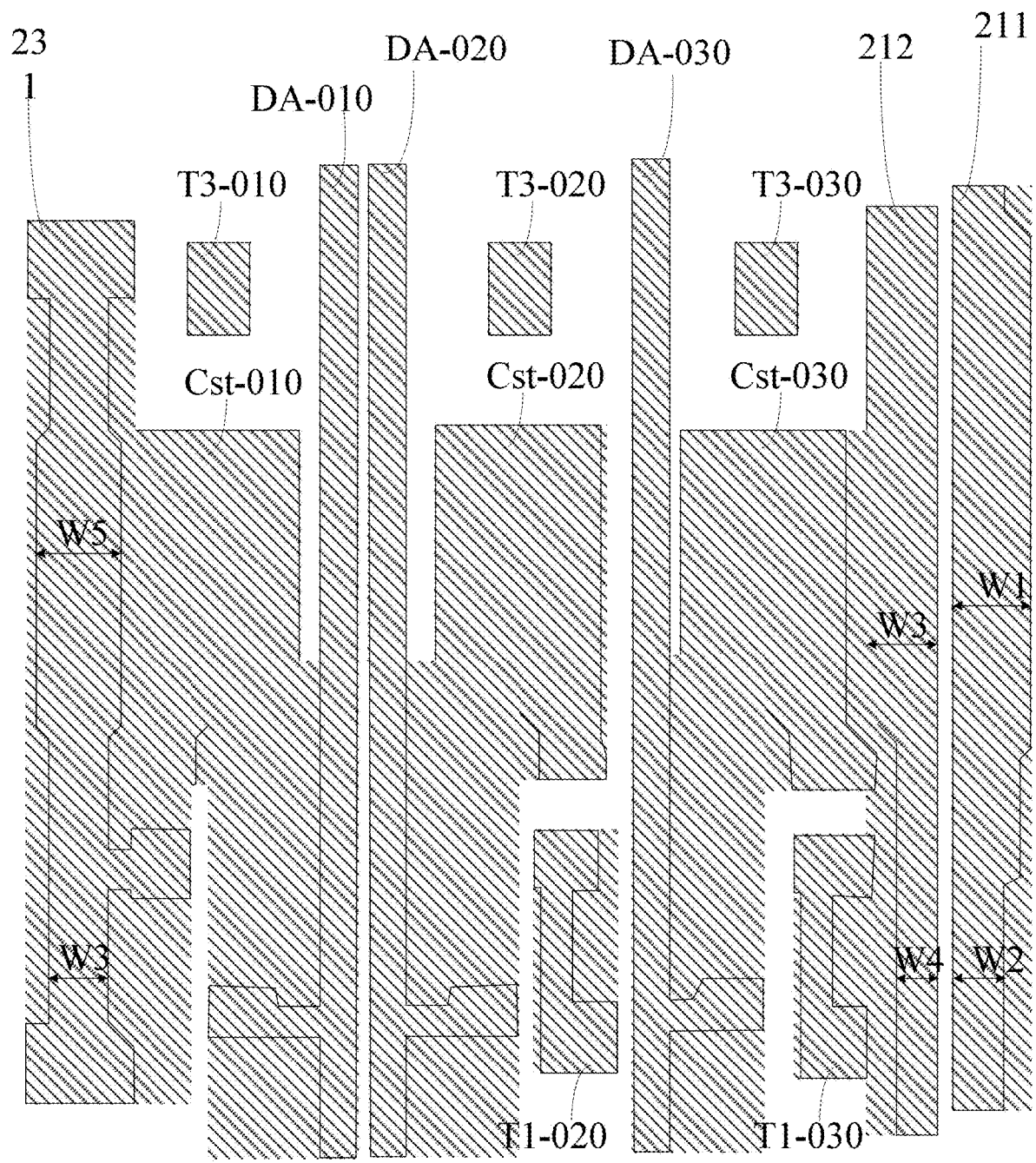
FIG. 5d is a structural schematic diagram of a first conducting layer in the display panels as shown in FIG. 3.

In some embodiments, as shown in FIG. 2b, FIG. 3 and FIG. 5d, the first auxiliary traces 211 may be located in gaps between two adjacent sub-pixel columns, and the cathode layer 400 is electrically connected with the first auxiliary traces 211 by the first via holes 310. In some embodiments, one of the auxiliary traces 210 is located in a gap between a third-color sub-pixel column and a first-color sub-pixel column. Further, the first auxiliary traces 211 may be located in gaps between two adjacent pixel unit columns. Of course, the embodiment of the present disclosure includes, but is not limited to this.

Optionally, as shown in FIG. 2a to FIG. 3, at least two adjacent pixel unit columns are taken as a first column group, one of the first column groups corresponds to one of the first auxiliary traces 211, and the first auxiliary traces 211 are located in gaps between two adjacent pixel unit columns in the corresponding first column group. In some embodiments, two adjacent pixel unit columns are taken as a first column group, for example, in a direction indicated by an arrow F2 (namely a direction from left to right), the first pixel unit column and the second pixel unit column may form the first first column group, and the third pixel unit column and the fourth pixel unit column may be taken as the second first column group. The first auxiliary trace 211 corresponding to the first first column group is located in a gap between the first pixel unit column and the second pixel unit column, and the first auxiliary trace 211 corresponding to the second first column group is located in a gap between the third pixel unit column and the fourth pixel unit column. The rest may be deduced by analogy, the descriptions thereof are omitted herein.

Optionally, it may also be arranged in a way that one auxiliary trace 210 is arranged in a gap between every two adjacent pixel unit columns. For example, in the direction indicated by the arrow F2 (namely the direction from left to right), one auxiliary trace 210 is arranged in the gap between the first pixel unit column and the second pixel unit column, one auxiliary trace 210 is arranged in a gap between the second pixel unit column and the third pixel unit column, and one auxiliary trace 210 is arranged in the gap between the third pixel unit column and the fourth pixel unit column. The rest may be deduced by analogy, the descriptions thereof are omitted herein.

In some embodiments, as shown in FIG. 2a, FIG. 3 and FIG. 5d, one detection line SL and one auxiliary trace 210 are correspondingly arranged in the same gap between the same pixel unit columns. For example, in the direction indicated by the arrow F2 (namely the direction from left to right), the first pixel unit column and the second pixel unit column may be taken as the first first column group, and the third pixel unit column and the fourth pixel unit column may be taken as the second first column group. The auxiliary trace 210 and the detection line SL corresponding to the first first column group are located in the gap between the first pixel unit column and the second pixel unit column, and the auxiliary trace 210 and the detection line SL corresponding to the second first column group are located in the gap between the third pixel unit column and the fourth pixel unit column. The rest may be deduced by analogy, the descriptions thereof are omitted herein.

In some embodiments, as shown in FIG. 2b, FIG. 3 and FIG. 4a, the display panel may further include a plurality of first connecting parts 520 arranged on the same layer with the anodes 510 and insulated from the anodes 510. Moreover, the first via holes 310 may include first sub-via holes 311 penetrating through the pixel defining layer 330 and second sub-via holes 312 penetrating through the planarization layer 320, wherein the cathode layer 400 is electrically connected with the first connecting parts 520 by the first sub-via holes 311, the first connecting parts 520 are electrically connected with the auxiliary traces 210 by the second sub-via holes 312, for example, the first connecting parts 520 are electrically connected with the first auxiliary traces 211 by the second sub-via holes 312. In order to achieve a better planarization effect, the planarization layer 320 is thicker than other insulating layers, and therefore, film layers between the cathode layer 400 and the auxiliary traces 210 are relatively thick; and if only one via hole is arranged, the via hole is relatively deep, and thus, it is possible that the cathode layer 400 and the auxiliary traces 210 cannot be really electrically connected to generate an open-circuit situation. Therefore, due to the arrangement of the first sub-via holes 311 and the second sub-via holes 312 in the embodiment of the present disclosure, it may be preferable that the auxiliary traces 210 are electrically connected with the first connecting parts 520 by the second sub-via holes 312, and then, the first connecting parts 520 are electrically connected with the cathode layer 400 by the first sub-via holes 311, so that the open-circuit situation caused by incapability of realizing real electrical connection due to the arrangement of only one via hole may be avoided.

In some embodiments, as shown in FIG. 3 and FIG. 4a, orthographic projections of the first sub-via holes 311 on the base substrate 100 may be at least partially not overlapped with orthographic projections of the second sub-via holes 312 on the base substrate 100. In some embodiments, as shown in FIG. 3 and FIG. 4a, the orthographic projection of the first sub-via hole 311 on the base substrate 100 is not overlapped with the orthographic projection of the second sub-via hole 312 on the base substrate 100. In this way, the problem that the cathode layer 400 cannot be electrically connected with the auxiliary traces 210 due to the excessively deep via holes may be further avoided.

Further, in order to further reduce the resistance of the cathode layer 400, in some embodiments, as shown in FIG. 3 and FIG. 4a, the first insulating layer 711 may be provided with second via holes 720, and the first auxiliary traces 211 are electrically connected with the second auxiliary traces 212 by the second via holes 720 penetrating through the first insulating layer 711. In this way, due to the arrangement of the first auxiliary traces 211 and the second auxiliary traces 212 which are electrically connected with each other and the electrical connection among the cathode layer 400, the first auxiliary traces 211 and the second auxiliary traces 212, the resistance of the cathode layer 400 may be further reduced, so that influences of IR Drop on the light emitting uniformity of the display panel can be further reduced, and the display effect of the display panel can be further improved.

In some embodiments, as shown in FIG. 2b, FIG. 3, FIG. 4a and FIG. 5c, the second auxiliary traces 212 include a plurality of first auxiliary parts 810 arranged at intervals; and in the same auxiliary trace 210, the first auxiliary trace 211 is electrically connected with the corresponding first auxiliary parts 810 by the second via holes 720. Further, in the same auxiliary trace 210, orthographic projection of the first auxiliary trace 211 on the base substrate 100 is overlapped with orthographic projections of the corresponding first auxiliary parts 810 on the base substrate 100. In some embodiments, in the same auxiliary trace 210, the orthographic projection of the first auxiliary trace 211 on the base substrate 100 cover orthographic projections of the corresponding first auxiliary parts 810 on the base substrate 100. In this way, the first auxiliary parts 810 may also be arranged between two adjacent sub-pixel columns, thereby preventing the first auxiliary parts 810 from affecting light emitting display.

In some embodiments, as shown in FIG. 2b, FIG. 3, FIG. 4a and FIG. 5c, orthographic projections of the first auxiliary parts 810 on the base substrate 100 cover orthographic projections of the corresponding second via holes 720 on the base substrate 100. In this way, the second via holes 720 may also be arranged between two adjacent sub-pixel columns, thereby avoiding affecting the light emitting display.

In some embodiments, as shown in FIG. 3, FIG. 4a and FIG. 5c, one of the first auxiliary traces 211 may correspond to a plurality of first auxiliary parts 810. Moreover, an orthographic projection of one of the first auxiliary parts 810 on the base substrate 100 is located between orthographic projections of the first gate line G1 and the second gate line G2 electrically connected with the sub-pixels in the same row on the base substrate 100.

In some embodiments, as shown in FIG. 2b, for the plurality of first auxiliary parts 810 electrically connected with the same first auxiliary trace 211, one sub-pixel row may correspond to one of the first auxiliary parts 810. Namely all rows of sub-pixels may be in one-to-one correspondence to the first auxiliary parts 810. For example, in an arrow direction F1, one of the first auxiliary parts 810 may be arranged between the first gate line G1 and the second gate line G2 electrically connected with sub-pixels of each row.

In some embodiments, as shown in FIG. 3, for the plurality of first auxiliary parts 810 electrically connected with the same first auxiliary trace 211, a sub-pixel row spaced apart from another sub-pixel row by at least one sub-pixel row may also correspond to one of the first auxiliary parts 810. For example, in the arrow direction F1, a sub-pixel row spaced apart from another sub-pixel row by one sub-pixel row may correspond to one of the first auxiliary parts 810, namely an odd sub-pixel row may correspond to one of the first auxiliary parts 810, or an even sub-pixel row may correspond to one of the first auxiliary parts 810. Or, in the arrow direction F1, a sub-pixel row spaced apart from another sub-pixel row by eleven sub-pixel rows may correspond to one of the first auxiliary parts 810, namely the first sub-pixel row may correspond to one of the first auxiliary parts 810, the thirteenth sub-pixel row may correspond to one of the first auxiliary parts 810, and the twenty-fifth sub-pixel row may correspond to one of the first auxiliary parts 810. The rest may be deduced by analogy, but is not limited herein. Of course, the present disclosure includes, but is not limited to this.

In some embodiments, as shown in FIG. 2b, FIG. 3, FIG. 4a and FIG. 5c, the first auxiliary parts 810 extend in the column direction F1. Further, for the first auxiliary part 810, the first gate line G1 and the second gate line G2 corresponding to the sub-pixels in the same row, the first auxiliary part 810 is closer to the second gate line G2.

In some embodiments, as shown in FIG. 2b, FIG. 3 and FIG. 5d, widths of parts, overlapped with the orthographic projections of the first auxiliary parts 810, of the first auxiliary traces 211 in the row direction of the sub-pixels are first widths W1, and widths of parts, overlapped with the orthographic projections of the first gate lines G1, of the first auxiliary traces 211 in the row direction of the sub-pixels are second widths W2, wherein the first widths are greater than the second widths. In this way, the area of the sub-pixels closest to the first auxiliary traces 211 can be increased by causing the first auxiliary traces 211 to avoid the sub-pixels.

In some embodiments, as shown in FIG. 2b, FIG. 3 and FIG. 5d, parts, having the second widths W2, of the first auxiliary traces 211 may be close to the second connecting holes 0120. In this way, the parts, close to the second connecting holes 0120, of the first auxiliary traces 211 may be used for avoiding the second connecting holes 0120.

In some embodiments, as shown in FIG. 2b, FIG. 3, FIG. 4a and FIG. 5c, each of the first auxiliary parts 810 may be electrically connected with the corresponding first auxiliary trace 211 by at least four second via holes 720. In some embodiments, each of the first auxiliary parts 810 may be electrically connected with the corresponding first auxiliary trace 211 by four, five, six or more second via holes 720. In this way, a plurality of electrical connection contacts may be arranged between each of the first auxiliary parts 810 and the corresponding first auxiliary trace 211, the electrical connection between the first auxiliary part 810 and the first auxiliary trace 211 may still be realized by other contacts even if fracture or breakage happens at any one contact, and thus, the risk that the first auxiliary part 810 and the first auxiliary trace 211 are disconnected is further reduced. Of course, the present disclosure includes, but is not limited to this.

In some embodiments, as shown in FIG. 2b, FIG. 3 and FIG. 4a, one of the auxiliary traces 210 may correspond to a plurality of first via holes 310, and one of the first via holes 310 corresponds to one sub-pixel row; for the first via hole 310, the first gate line G1 and the second gate line G2 corresponding to the sub-pixels in the same row, the orthographic projection of the first sub-via hole 311 on the base substrate 100 is overlapped with an orthographic projection of the second gate line G2 based on the base substrate 100; and orthographic projection of the second sub-via hole 312 based on the base substrate 100 is located between an orthographic projection of the first gate line G1 on the base substrate 100 and the orthographic projection of the second gate line G2 on the base substrate 100.

In some embodiments, as shown in FIG. 2b, FIG. 3 and FIG. 4a, for the second sub-via hole 312, the second via holes 720 and the second gate line G2 corresponding to the sub-pixel in the same row, orthographic projection of the second sub-via hole 312 on the base substrate 100 is located between the orthographic projection of the second gate line G2 on the base substrate 100 and the orthographic projection of all the second via holes 720 on the base substrate 100 as a whole.

In some embodiments, as shown in FIG. 2b, FIG. 3 and FIG. 4a, the plurality of second via holes 720 corresponding to the same first auxiliary trace 211 may be arranged in the same straight line in the column direction F1.

Figure 4B:
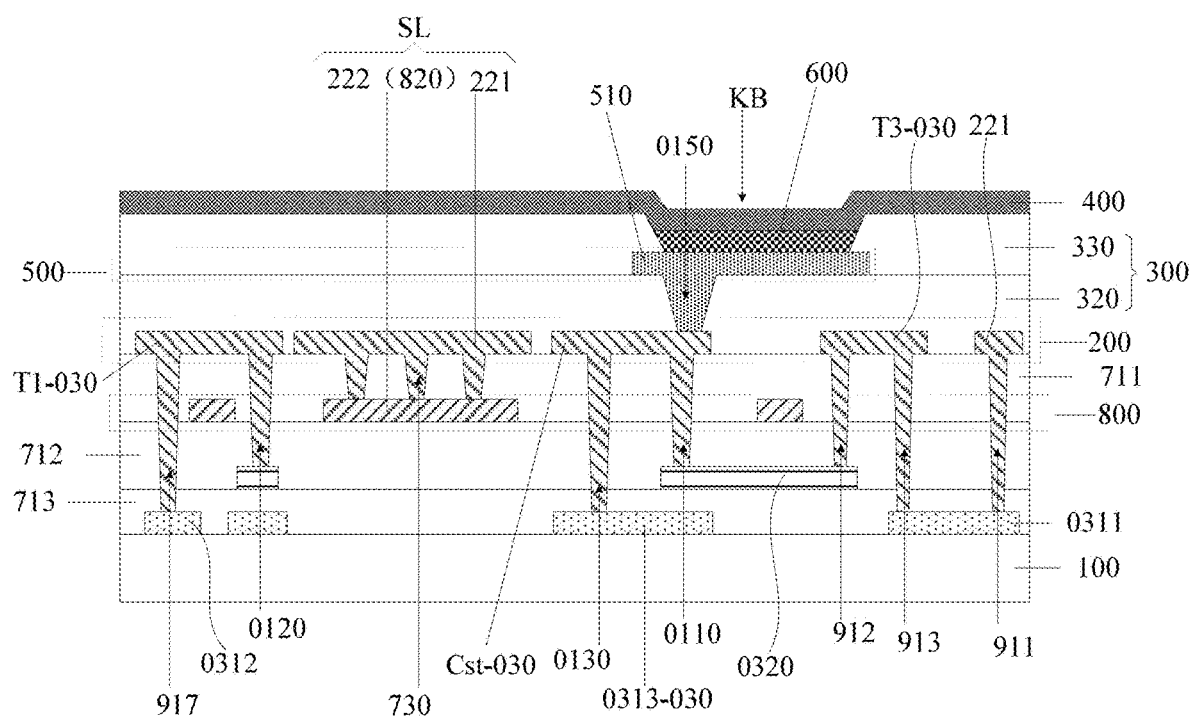
FIG. 4b is a sectional structural schematic diagram of the display panels as shown in FIG. 3 in a direction BB'.

In some embodiments, as shown in FIG. 2b, FIG. 3 and FIG. 4b, the signal lines with the double-layer alignment structures may include the detection lines SL. In this way, due to the arrangement of the electrically connected double-layer alignments of the detection lines SL, the resistances of the detection lines SL may be reduced, so that influences of IR Drop on the light emitting uniformity of the display panel can be reduced, and the display effect of the display panel can be improved.

In some embodiments, as shown in FIG. 2b, FIG. 3 and FIG. 4b, the detection lines SL may include first detection traces 221 located on the first conducting layer 200 and second detection traces 222 located on the second conducting layer 800. The first insulating layer 711 is provided with third via holes 730, and the first detection traces 221 are electrically connected with the second detection traces 222 by the third via holes 730 penetrating through the first insulating layer 711.

In some embodiments, as shown in FIG. 2b, FIG. 3 and FIG. 4b, the first detection traces 221 extend in the column direction F1 of the sub-pixel and are arranged in the row direction of the sub-pixels. Of course, the embodiment of the present disclosure includes, but is not limited to this.

In some embodiments, as shown in FIG. 2b, FIG. 3 and FIG. 4b, the first conducting layer 200 may further include a plurality of second connecting parts (namely the capacitor electrode parts Cst-010, Cst-020 and Cst-030), moreover, the planarization layer 320 further includes fifth connecting holes 0150 by which a part of the second connecting parts (namely the capacitor electrode parts Cst-010, Cst-020 and Cst-030) is exposed; and the anodes 510 are electrically connected with the second connecting parts (namely the capacitor electrode parts Cst-010, Cst-020 and Cst-030) by the fifth connecting holes 0150. In some embodiments, the planarization layer 320 is provided with the fifth connecting holes 0150, and each of the sub-pixels corresponds to one of the fifth connecting holes 0150. The anodes 510 in the first-color sub-pixel 010 are electrically connected with the capacitor electrode part Cst-010 by the fifth connecting hole 0150, the anodes 510 in the second-color sub-pixel 020 are electrically connected with the capacitor electrode part Cst-020 by the fifth connecting hole 0150, and the anodes 510 in the third-color sub-pixel 030 are electrically connected with the capacitor electrode part Cst-030 by the fifth connecting hole 0150.

In some embodiments, as shown in FIG. 2b, FIG. 3, FIG. 4b and FIG. 5c, the second detection traces 222 may further include a plurality of second auxiliary parts 820 arranged at intervals, wherein in the same detection line SL, the first detection trace 221 is electrically connected with the corresponding second auxiliary parts 820 by the third via holes 730 respectively. Moreover, one of the first detection traces 221 corresponds to at least one of the second auxiliary parts 820, and the first detection trace 221 is electrically connected with the corresponding second auxiliary part 820 by the third via holes 730.

In some embodiments, as shown in FIG. 2b, FIG. 3 and FIG. 4b, in the same detection line SL, an orthographic projection of the first detection trace 221 on the base substrate 100 is overlapped with orthographic projections of the corresponding second auxiliary parts 820 on the base substrate 100. Further, in the same detection line SL, the orthographic projection of the first detection trace 221 on the base substrate 100 covers the orthographic projections of the corresponding second auxiliary parts 820 on the base substrate 100. In this way, influences of the second auxiliary parts 820 on display may be avoided.

In some embodiments, as shown in FIG. 2b, FIG. 3 and FIG. 4b, orthographic projections of the first connecting parts 520 on the base substrate 100 are not overlapped with orthographic projections of the third via holes 730 on the base substrate 100.

In some embodiments, as shown in FIG. 2b, FIG. 3, FIG. 4b and FIG. 5c, one of the first detection traces 221 may correspond to a plurality of second auxiliary parts 820, and an orthographic projection of one of the second auxiliary parts 820 on the base substrate 100 is located between the orthographic projections of the first gate line G1 and the second gate line G2 electrically connected with the sub-pixels in the same row on the base substrate 100.

In some embodiments, as shown in FIG. 2b, for the plurality of second auxiliary parts 820 electrically connected to the same first detection trace 221, one sub-pixel row may correspond to one of the second auxiliary parts 820. Namely all rows of sub-pixels may be in one-to-one correspondence to the second auxiliary parts 820. For example, in an arrow direction F1, one of the second auxiliary parts 820 may be arranged between the first gate line G1 and the second gate line G2 electrically connected with sub-pixels of each row.

In some embodiments, as shown in FIG. 3, for the plurality of second auxiliary parts 820 electrically connected with the same first auxiliary trace 221, a sub-pixel row spaced apart from another sub-pixel row by at least one sub-pixel row may correspond to one of the second auxiliary parts 820. For example, in the arrow direction F1, a sub-pixel row spaced apart from another sub-pixel row by one sub-pixel row may correspond to one of the second auxiliary parts 820, namely an odd sub-pixel row may correspond to one of the second auxiliary parts 820, or an even sub-pixel row may correspond to one of the second auxiliary parts 820. Or, in the arrow direction F1, a sub-pixel row spaced apart from another sub-pixel row by eleven sub-pixel rows may correspond to one of the second auxiliary parts 820, namely the first sub-pixel row may correspond to one of the second auxiliary parts 820, the thirteenth sub-pixel row may correspond to one of the second auxiliary parts 820, and the twenty-fifth sub-pixel row may correspond to one of the second auxiliary parts 820. The rest may be deduced by analogy, but is not limited herein. Of course, the present disclosure includes, but is not limited to this.

In some embodiments, as shown in FIG. 2b, FIG. 3, FIG. 4b and FIG. 5c, the second auxiliary parts 820 extend in the column direction F1. Further, for the second auxiliary part 820, the first gate line G1 and the second gate line G2 corresponding to the sub-pixels in the same row, the second auxiliary part 820 is closer to the second gate line G2.

In some embodiments, as shown in FIG. 2b, FIG. 3, FIG. 4b and FIG. 5c, each of the second auxiliary parts 820 may be electrically connected with the corresponding first detection trace 221 by at least three third via holes 730. In some embodiments, each of the second auxiliary parts 820 may be electrically connected with the corresponding first detection trace 221 by three, four, five or more third via holes 730. In this way, a plurality of electrical connection contacts may be arranged between each of the second auxiliary parts 820 and the corresponding first detection trace 221, the electrical connection between the second auxiliary part 820 and the first detection trace 221 may still be realized by other contacts even if fracture or breakage happens at any one contact, and thus, the risk that the second auxiliary part 820 and the first detection trace 221 are disconnected is further reduced. Of course, the present disclosure includes, but is not limited to this.

In some embodiments, as shown in FIG. 2b, FIG. 3, FIG. 4b and FIG. 5c, orthographic projections of the second auxiliary parts 820 on the base substrate 100 cover orthographic projections of the corresponding third via holes 730 on the base substrate 100. In this way, the third via holes 730 may also be arranged between two adjacent sub-pixel columns, thereby avoiding affecting the light emitting display.

In some embodiments, as shown in FIG. 2b, FIG. 3 and FIG. 4b, third connecting holes 0130 of sub-pixels in one row are arranged in a straight line in the row direction, fourth connecting holes 0140 of sub-pixels in one row are also arranged in a straight line in the row direction, for the third via holes 730, the first gate line G1 and the second gate line G2 corresponding to the sub-pixels in the same row, the orthographic projection of the third via hole 730 on the base substrate 100 is located between the straight line formed by the arrangement of the third connecting holes 0130 in the row direction F1 and the straight line formed by the arrangement of the fourth connecting holes 0140 in the row direction F1.

In some embodiments, as shown in FIG. 2b, FIG. 3 and FIG. 4b, the plurality of third via holes 730 corresponding to the same first detection trace 221 may be arranged on the same straight line in the column direction F1.

In some embodiments, as shown in FIG. 2b, FIG. 3 and FIG. 4b, two adjacent pixel unit columns are taken as a second column group, the sub-pixels in each of the second column groups are correspondingly and electrically connected with one of the first detection traces 221. For example, in a direction indicated by an arrow F2 (namely a direction from left to right), the first pixel unit column and the second pixel unit column are taken as the first second column group, and the third pixel unit column and the fourth pixel unit column are taken as the second second column group. The first detection trace 221 corresponding to the first second column group is located in a gap between the first pixel unit column and the second pixel unit column, and the sensing transistor in each of the sub-pixels in the first second column group is electrically connected with the corresponding first detection trace 221. The first detection trace 221 corresponding to the second second column group is located in a gap between the third pixel unit column and the fourth pixel unit column, and the sensing transistor in each of the sub-pixels in the second second column group is electrically connected with the corresponding first detection trace 221. The rest may be deduced by analogy, the descriptions thereof are omitted herein.

In some embodiments, as shown in FIG. 2b, FIG. 3, FIG. 4b, and FIG. 5d, each of the first detection traces 221 is correspondingly and electrically connected with a plurality of first connecting traces 0311, and for the first connecting traces 0311 electrically connected with the same first detection trace 221, all rows of sub-pixels in the second column group are in one-to-one correspondence to the first connecting traces 0311. Moreover, sub-pixels of each row in the second column group are electrically connected with the first detection trace 221 by the corresponding first connecting trace 0311. In some embodiments, the first detection trace 221 is electrically connected with the corresponding first connecting traces 0311 by via holes 911 penetrating through the first insulating layer 711, the second insulating layer 712 and the third insulating layer 713. Moreover, the first conducting layer 200 may further include a plurality of third connecting parts, and each of the sub-pixels is internally provided with a third connecting part. For example, the first-color sub-pixel 010 is internally provided with a third connecting part T3-010, the second-color sub-pixel 020 is internally provided with a third connecting part T3-020, and the third-color sub-pixel 030 is internally provided with a third connecting part T3-030. Moreover, one end of the third connecting part T3-030 is electrically connected with the region serving as the drain region of the sensing transistor in the active semiconductor layer 0320 by a via hole 912 penetrating through the first insulating layer 711 and the second insulating layer 712, and the other end of the third connecting part T3-030 is electrically connected with the corresponding first connecting trace 0311 by a via hole 913 penetrating through the first insulating layer 711, the second insulating layer 712 and the third insulating layer 713. One end of the third connecting part T3-010 of the first-color sub-pixel 010 is electrically connected with the region serving as the drain region of the sensing transistor in the active semiconductor layer 0320 by a via hole penetrating through the first insulating layer 711 and the second insulating layer 712, and the other end of the third connecting part T3-010 is electrically connected with the corresponding first connecting trace 0311 by a via hole penetrating through the first insulating layer 711, the second insulating layer 712 and the third insulating layer 713. One end of the third connecting part T3-020 of the second-color sub-pixel 020 is electrically connected with the region serving as the drain region of the sensing transistor in the active semiconductor layer 0320 by a via hole penetrating through the first insulating layer 711 and the second insulating layer 712, and the other end of the third connecting part T3-020 is electrically connected with the corresponding first connecting trace 0311 by a via hole penetrating through the first insulating layer 711, the second insulating layer 712 and the third insulating layer 713. It should be noted that FIG. 4b is only described with the third connecting part T3-030 as an example, and implementation ways of the third connecting part T3-010 and the third connecting part T3-020 may be deduced by analogy, the descriptions thereof are omitted herein.

In some embodiments, as shown in FIG. 2a to FIG. 3, one of the first detection traces 221 and one of the first auxiliary traces 211 may be both arranged in a same gap between the pixel unit columns. In this way, the first detection trace 221 for transmitting detection signals and the first auxiliary trace 211 for transmitting fixed voltages are arranged in the same gap, so that influences of signals on the detection signals transmitted by the first detection trace 221 can be reduced, and the precisions of the signals transmitted by the first detection trace 221 can be improved.

In some embodiments, as shown in FIG. 2b, FIG. 3 and FIG. 4a, for the first detection traces 221 and the first auxiliary traces 211 arranged in the same gaps between the pixel unit columns, the orthographic projections of the first sub-via holes 311 corresponding to the first auxiliary traces 211 on the base substrate 100 are further overlapped with the orthographic projections of the first detection traces 221 on the base substrate 100.

In some embodiments, as shown in FIG. 2b, FIG. 3 and FIG. 4a, for the first detection traces 221 and the first auxiliary traces 211 arranged in the same gaps between the pixel unit columns, the orthographic projections of the first connecting parts 520 on the base substrate 100 are also overlapped with the orthographic projections of the first detection traces 221 on the base substrate 100. Moreover, the orthographic projections of the first connecting parts 520 on the base substrate 100 are also overlapped with the orthographic projections of the first auxiliary traces 211 on the base substrate 100.

In some embodiments, as shown in FIG. 2b and FIG. 3, one of the second auxiliary parts 820 and one of the first auxiliary parts 810 may correspond to the same sub-pixel row. In this way, the design way of the second auxiliary parts 820 and the first auxiliary parts 810 may be simplified, and the design difficulty may be lowered.

In some embodiments, as shown in FIG. 2b and FIG. 3, for the first auxiliary parts 810 and the second auxiliary parts 820 corresponding to the sub-pixels in the same row, the second via holes 720 of the first auxiliary part 810 are staggered with the third via holes 730 of the second auxiliary part 820. For example, the geometric center of each of the second via holes 720 corresponds to a gap between two of the third via holes 730.

In some embodiments, as shown in FIG. 2b, FIG. 3 and FIG. 5d, widths of parts, overlapped with the orthographic projections of the second auxiliary parts 820, of the first detection traces 221 in a row direction of the sub-pixels are third widths W3, and widths of parts, overlapped with the orthographic projections of the first gate lines G1, of the first detection traces 221 in the row direction of the sub-pixels are fourth widths W4, wherein the third widths W3 are greater than the fourth widths W4. In this way, the area of the sub-pixels closest to the first detection traces 221 may be increased by causing the first detection traces 221 to avoid the sub-pixels.

In some embodiments, as shown in FIG. 2b, FIG. 3 and FIG. 5d, the parts, having the fourth widths W4, of the first detection traces 221 may be close to the second connecting holes 0120. In this way, the parts, close to the second connecting holes 0120, of the first detection traces 221 may be used for avoiding the second connecting holes 0120.

Figure 4C:
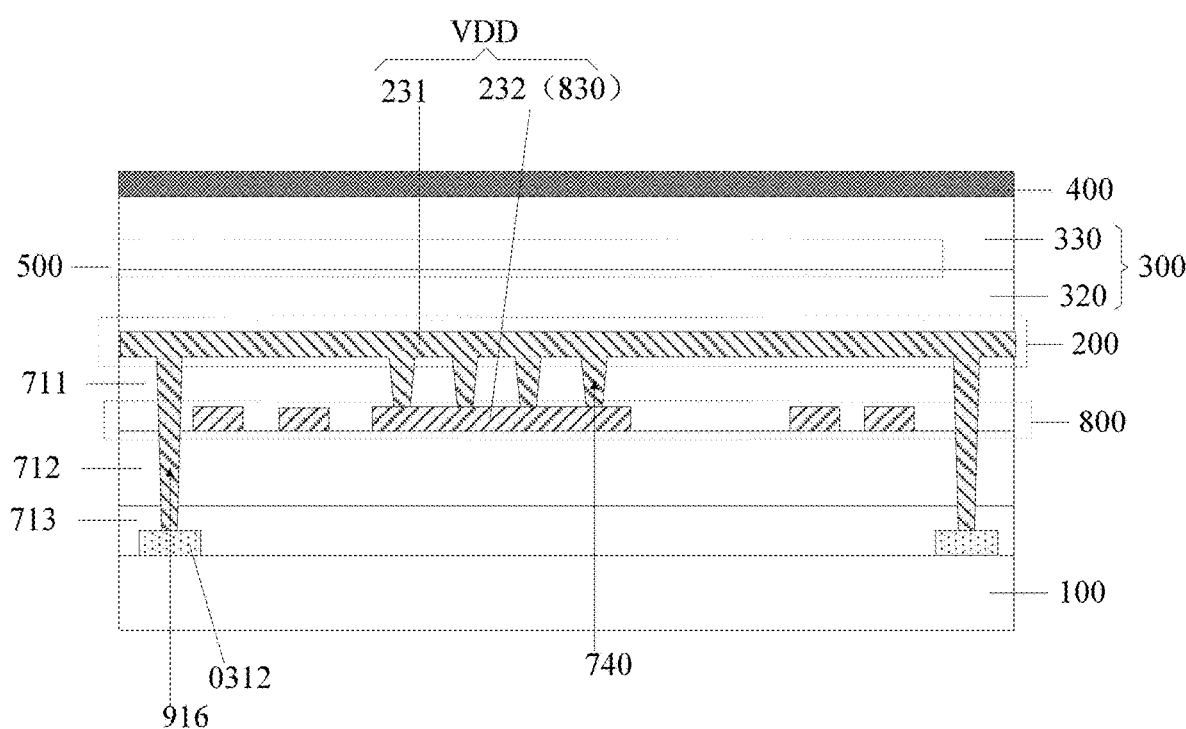
FIG. 4c is a sectional structural schematic diagram of the display panels as shown in FIG. 3 in a direction CC'.

In some embodiments, as shown in FIG. 2b, FIG. 3 and FIG. 4c, the signal lines with the double-layer alignment structures may include the power lines VDD. In this way, due to the arrangement of the electrically connected double-layer alignments of the power lines VDD, the resistances of the power lines VDD may be reduced, so that influences of IR Drop on the light emitting uniformity of the display panel can be reduced, and the display effect of the display panel can be improved.

In some embodiments, as shown in FIG. 2b, FIG. 3 and FIG. 4c, the power lines VDD include first power traces 231 located on the first conducting layer 200 and second power traces 232 located on the second conducting layer 800, wherein the first insulating layer 711 is provided with fourth via holes 740, and the first power traces 231 are electrically connected with the second power traces 232 by the fourth via holes 740 penetrating through the first insulating layer 711.

In some embodiments, as shown in FIG. 2b, FIG. 3 and FIG. 4c, the first power traces 231 extend in the column direction F1 of the sub-pixel and are arranged in the row direction of the sub-pixels. Of course, the embodiment of the present disclosure includes, but is not limited to this.

In some embodiments, as shown in FIG. 2b, FIG. 3 and FIG. 4c, each of the first power traces 231 is correspondingly and electrically connected with a plurality of second connecting traces 0312. In a direction indicated by an arrow F2 (namely a direction from left to right), the first pixel unit column is correspondingly and electrically connected with one of the first power traces 231, the last pixel unit column is correspondingly and electrically connected with one of the first power traces 231, for pixel unit columns except the first pixel unit column and the last pixel unit column, two adjacent pixel unit columns are taken as a third column group, the sub-pixels in each of the third column groups are correspondingly and electrically connected with one of the first power traces 231. For example, in the direction indicated by the arrow F2 (namely the direction from left to right), the second pixel unit column and the third pixel unit column are taken as the first third column group, the fourth pixel unit column and the fifth pixel unit column may be taken as the second third column group. The first power traces 231 corresponding to the first third column group are located in a gap between the second pixel unit column and the third pixel unit column, and the driving transistor in each of the sub-pixels in the first third column group is electrically connected with the corresponding first power trace 231. The first power trace 231 corresponding to the second third column group is located in a gap between the fourth pixel unit column and the fifth pixel unit column, and the driving transistor in each of the sub-pixels in the second third column group is electrically connected with the corresponding first power trace 231. The rest may be deduced by analogy, the descriptions thereof are omitted herein.

In some embodiments, as shown in FIG. 2b, FIG. 3, FIG. 4a, FIG. 4c and FIG. 5d, the first power trace 231 and the first auxiliary trace 211 are spaced for at least one column of pixel units. In some embodiments, the first power trace 231 and the first auxiliary trace 211 may be spaced for one column of pixel units. Or, the first power trace 231 and the first auxiliary trace 211 may be spaced for two, three, four or more columns of pixel units, which is not limited herein.

In some embodiments, as shown in FIG. 2b, FIG. 3 and FIG. 4c, each of the first power traces 231 is correspondingly and electrically connected with a plurality of second connecting traces 0312, and for the second connecting traces 0312 electrically connected with the same first power trace 231, all rows of sub-pixels in the third column group are in one-to-one correspondence to the second connecting traces 0312. Moreover, each row of sub-pixels in the third column group is electrically connected with the first power trace 231 by the corresponding second connecting trace 0312. In some embodiments, the first power trace 231 is electrically connected with the corresponding second connecting traces 0312 by via holes 916 penetrating through the first insulating layer 711, the second insulating layer 712 and the third insulating layer 713.

In some embodiments, as shown in FIG. 2b, FIG. 3, FIG. 4c and FIG. 5c, the second power trace 232 may include a plurality of third auxiliary parts 830 arranged at intervals, wherein in the same power line VDD, the first power trace 231 is electrically connected with the corresponding third auxiliary parts 830 by the fourth via holes 740. Moreover, one of the first power traces 231 corresponds to at least one of the third auxiliary parts 830, and is electrically connected with the corresponding third auxiliary parts 830 by the fourth via holes 740.

In some embodiments, as shown in FIG. 3 and FIG. 4c, orthographic projections of the first power traces 231 on the base substrate 100 are overlapped with orthographic projections of the corresponding third auxiliary parts 830 on the base substrate 100. Further, the orthographic projections of the first power traces 231 on the base substrate 100 cover orthographic projections of the corresponding third auxiliary parts 830 on the base substrate 100. In this way, influences of the third auxiliary parts 830 on display may be avoided.

In some embodiments, as shown in FIG. 2b, FIG. 3, FIG. 4c and FIG. 5c, one of the first power traces 231 may correspond to a plurality of third auxiliary parts 830, and an orthographic projection of one of the third auxiliary parts 830 on the base substrate 100 is located between the orthographic projections of the first gate line G1 and the second gate line G2 electrically connected with the sub-pixels in the same row on the base substrate 100.

In some embodiments, as shown in FIG. 2b, for the plurality of third auxiliary parts 830 electrically connected to the same first power trace 231, one sub-pixel row may correspond to one of the third auxiliary parts 830. Namely all rows of sub-pixels may be in one-to-one correspondence to the third auxiliary parts 830. For example, in an arrow direction F1, one of the third auxiliary parts 830 may be arranged between the first gate line G1 and the second gate line G2 electrically connected with the sub-pixels of each row.

In some embodiments, as shown in FIG. 3, for the plurality of third auxiliary parts 830 electrically connected with the same first power trace 231, a sub-pixel row spaced apart from another sub-pixel row by at least one sub-pixel row may correspond to one of the third auxiliary parts 830. For example, in the arrow direction F1, a sub-pixel row spaced apart from another sub-pixel row by one sub-pixel row may correspond to one of the third auxiliary parts 830, namely an odd sub-pixel row may correspond to one of the third auxiliary parts 830, or an even sub-pixel row may correspond to one of the third auxiliary parts 830. Or, in the arrow direction F1, a sub-pixel row spaced apart from another sub-pixel row by eleven sub-pixel rows may correspond to one of the third auxiliary parts 830, namely a first sub-pixel row may correspond to one of the third auxiliary parts 830, a thirteenth sub-pixel row may correspond to one of the third auxiliary parts 830, and a twenty-fifth sub-pixel row may correspond to one of the third auxiliary parts 830. The rest may be deduced by analogy, but is not limited herein. Of course, the present disclosure includes, but is not limited to this.

In some embodiments, as shown in FIG. 3, FIG. 4c and FIG. 5c, the third auxiliary parts 830 extend in the column direction F1. Further, for the third auxiliary parts 830, the first gate line G1 and the second gate line G2 corresponding to the sub-pixels in the same row, the third auxiliary parts 830 are closer to the second gate line G2.

In some embodiments, as shown in FIG. 2b, FIG. 3, FIG. 4c and FIG. 5c, each of the third auxiliary parts 830 may be electrically connected with the corresponding first power trace 231 by at least four fourth via holes 740. In some embodiments, each of the third auxiliary parts 830 may be electrically connected with the corresponding first power trace 231 by three, four, five or more fourth via holes 740. In this way, a plurality of electrical connection contacts may be arranged between each of the third auxiliary parts 830 and the corresponding first power trace 231, the connection between the third auxiliary part 830 and the first power trace 231 may still be realized by other contacts even if fracture or breakage happens at any one contact, and thus, the risk that the third auxiliary part 830 and the first power trace 231 are disconnected is further reduced. Of course, the present disclosure includes, but is not limited to this.

In some embodiments, as shown in FIG. 2b, FIG. 3, FIG. 4c and FIG. 5c, orthographic projections of the third auxiliary parts 830 on the base substrate 100 cover orthographic projections of the corresponding fourth via holes 740 on the base substrate 100. In this way, the fourth via holes 740 may also be arranged between adjacent sub-pixel columns, thereby avoiding affecting the light emitting display.

In some embodiments, as shown in FIG. 2b, FIG. 3 and FIG. 4c, for the fourth via holes 740, the first gate line G1 and the second gate line G2 corresponding to the sub-pixels in the same row, the orthographic projections of the fourth via holes 740 on the base substrate 100 are located between the orthographic projection of the first gate line G1 on the base substrate 100 and the orthographic projection of the second gate line G2 on the base substrate 100.

In some embodiments, as shown in FIG. 2b, FIG. 3 and FIG. 4c, the plurality of fourth via holes 740 corresponding to the same first power trace 231 may be arranged in the same straight line in the column direction F1.

In some embodiments, as shown in FIG. 2b, FIG. 3 and FIG. 4c, for the first connecting holes 0110 and the third auxiliary parts 830 corresponding to the sub-pixels in the same row, one of the fourth via holes 740 corresponding to the third auxiliary parts 830 and the first connecting holes 0110 are arranged in a straight line in the row direction of the sub-pixels.

In some embodiments, as shown in FIG. 2b and FIG. 3, one of the third auxiliary parts 830 and one of the first auxiliary parts 810 may correspond to the same sub-pixel row. In this way, the design way of the third auxiliary parts 830 and the first auxiliary parts 810 may be simplified, and the design difficulty may be lowered.

Further, in the embodiment of the present disclosure, as shown in FIG. 2b and FIG. 3, one of the third auxiliary parts 830, one of the second auxiliary parts 820 and one of the first auxiliary parts 810 may correspond to the same sub-pixel row. In this way, the design way of the third auxiliary parts 830, the second auxiliary parts 820 and the first auxiliary parts 810 may be simplified, and the design difficulty may be lowered.

In some embodiments, as shown in FIG. 2b, FIG. 3 and FIG. 5d, widths of parts, overlapped with the orthographic projections of the third auxiliary parts 830, of the first power traces 231 in a row direction of the sub-pixels are fifth widths W5, and widths of parts, overlapped with the orthographic projections of the first gate lines G1, of the first power traces 231 in the row direction of the sub-pixels are sixth widths W6, wherein the fifth widths W5 are greater than the sixth widths W6. In this way, the area of the sub-pixels closest to the first power traces 231 may be increased by causing the first power traces 231 to avoid the sub-pixels.

In some embodiments, as shown in FIG. 2b, FIG. 3 and FIG. 5d, the parts, having the sixth widths W6, of the first power traces 231 may be close to the second connecting holes 0120. In this way, parts, close to the second connecting holes 0120, of the first power traces 231 may be used for avoiding the second connecting holes.

It should be noted that the first widths, the second widths, the third widths, the fourth widths, the fifth widths and the sixth widths mentioned above may be designed and determined according to an actual application environment, and are not limited herein.

It should be noted that the "same" in the above-mentioned features may not be identical and may have some deviations in an actual process due to restrictions of process conditions or other factors, and therefore, the same relationship among all the above-mentioned features shall fall within the protective scope of the present disclosure as long as they approximately meet the above-mentioned conditions. For example, the above-mentioned "same" may be the same allowed within an error allowable range.

Based on the same inventive concept, an embodiment of the present disclosure further provides a display device, including the above-mentioned display panel provided by the embodiment of the present disclosure. The problem solving principle of the display device is similar to that of the above-mentioned display panel, and therefore, the implementation of the display device may refer to that of the above-mentioned display panel, the descriptions thereof are omitted herein.

Figure 6:
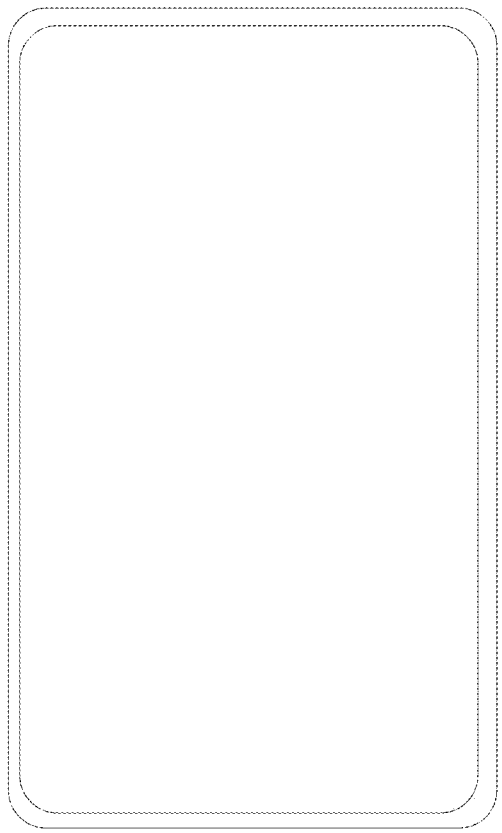
FIG. 6 is a structural schematic diagram of a display device provided by an embodiment of the present disclosure.

In some embodiments, the display device may be a full-screen mobile phone shown in FIG. 6.

Of course, in some embodiments, the display device may further be any one product or component with a display function, such as a tablet personal computer, a television, a display, a notebook computer, a digital photo frame and a navigator. The ordinary skill in the art should understand that other essential components of the display device are provided, the descriptions thereof are omitted herein, and they should not be regarded as limitations on the present disclosure.

Due to the arrangement of the double-layer alignment structures of which the double-layer alignments are electrically connected with each other in the display panel and the display device provided by the embodiments of the present disclosure, the resistances of the signal lines provided with the double-layer alignment structures may be reduced, so that influences of IR Drop on the light emitting uniformity of the display panel may be reduced, and the display effect of the display panel may be improved.

Obviously, orthographic projections skilled in the art can make changes and modifications to the present disclosure without facing away from the spirit and scope of the present disclosure. Thus, the present disclosure is also intended to encompass these changes and modifications if such changes and modifications of the present disclosure are within the scope of the claims of the present disclosure and equivalents thereof.

What is claimed is:

1. A display panel, comprising:
   a base substrate;
   a plurality of pixel units, arranged on the base substrate in an array,
      wherein at least one pixel unit comprises a plurality of sub-pixels, and at least one sub-pixel comprises a sensing transistor and a driving transistor; and
   a plurality of gate line groups,
      wherein each gate line group comprises a first gate line and a second gate line located at two sides of one respective row of the pixel units;
         wherein in a same sub-pixel row, for a first gate line and a second gate line corresponding to sub-pixels in the same sub-pixel row, sensing transistors are located at a side, closer to the second gate line, of the sub-pixels, and driving transistors are located at a side, closer to the first gate line, of the sub-pixels;
         wherein, in a same sub-pixel of the at least one sub-pixel, a first electrode of a sensing transistor is electrically connected with a second electrode of a driving transistor by a first connecting hole, and a first electrode of the driving transistor is electrically connected with a power line by a second connecting hole; and
         wherein in the same sub-pixel row, for two sub-pixels close to each other and located in different pixel units, at least one of signal lines in a region defined by first connecting holes and second connecting holes of the two sub-pixels has a double-layer alignment structure, and double-layer alignments of a double-layer alignment structure of a same signal line are electrically connected with each other.

2. The display panel of claim 1, wherein the at least one sub-pixel further comprises: anodes, a light emitting functional layer and a cathode layer arranged in a stack, and
   wherein in a same sub-pixel of the at least one sub-pixel, a second electrode of the driving transistor is electrically connected with anodes;
   the display panel further comprises:
      a plurality of auxiliary traces,
         wherein each auxiliary trace is located in a gap between two adjacent sub-pixel columns, and electrically connected with the cathode layer by a first via hole;
      a plurality of detection lines,
         wherein each detection line is located in a gap between two adjacent sub-pixel columns, insulated from the each auxiliary trace and electrically connected with a second electrode of the sensing transistor; and
      wherein the signal lines comprise at least one of the auxiliary traces, the detection lines and the power lines.

3. The display panel of claim 2, further comprising:
   a pixel defining layer, disposed between a layer on which the anodes are located and the light emitting functional layer;
   a planarization layer, disposed on a side, facing the base substrate, of the pixel defining layer;
   a first conducting layer, disposed on a side, facing the base substrate, of the planarization layer;
   a first insulating layer, disposed on a side, facing the base substrate, of the first conducting layer; and
   a second conducting layer, disposed on a the side, facing the base substrate, of the first insulating layer;
   wherein the plurality of auxiliary traces comprising:
      first auxiliary traces, located on the first conducting layer and extending in a column direction of the plurality of sub-pixels; and
      second auxiliary traces, located on the second conducting layer; and
         wherein the first auxiliary traces are electrically connected with the second auxiliary traces by second via holes penetrating through the first insulating layer.

4. The display panel of claim 3, wherein a second auxiliary trace comprises a plurality of first auxiliary parts arranged at intervals, and wherein:
   in a same auxiliary trace, a first auxiliary trace is electrically connected with corresponding first auxiliary parts by the second via holes, respectively.

5. The display panel of claim 4, wherein in the same auxiliary trace,
   an orthographic projection of the first auxiliary trace on the base substrate is overlapped with orthographic projections of the corresponding first auxiliary parts on the base substrate.

6. The display panel of claim 4, wherein:
   the orthographic projections of the plurality of first auxiliary parts on the base substrate cover orthographic projections of corresponding second via holes on the base substrate.

7. The display panel of claim 4, wherein in a same first auxiliary trace:
   for a plurality of first auxiliary parts electrically connected to the same first auxiliary trace, one first auxiliary part corresponds to one sub-pixel row.

8. The display panel of claim 4, wherein in a same first auxiliary trace:
   for a plurality of first auxiliary parts electrically connected to the same first auxiliary trace, one first auxiliary part corresponds to a sub-pixel row, and the sub-pixel row is spaced from another sub-pixel row corresponding to another first auxiliary part by at least one sub-pixel row.

9. The display panel of claim 4, wherein:
each first auxiliary trace is electrically connected with each of corresponding first auxiliary parts by at least four second via holes.

10. The display panel of claim 4, wherein in a same sub-pixel row:
for first auxiliary parts, a first gate line and a second gate line corresponding to the same sub-pixel row, the first auxiliary parts are closer to the second gate line.

11. The display panel of claim 4, wherein:
overlapping area between orthographic projections of first via holes on the base substrate and orthographic projections of the anodes on the base substrate is zero.

12. The display panel of claim 4, further comprising:
a plurality of first connecting parts, located on a same layer with the anodes and insulated from the anodes; wherein
first via holes comprise first sub-via holes penetrating through the pixel defining layer and second sub-via holes penetrating through the planarization layer; and
the cathode layer is electrically connected with the plurality of first connecting parts by first sub-via holes, and the first connecting parts are electrically connected with the plurality auxiliary traces by the second sub-via holes.

13. The display panel of claim 12, wherein:
at least a portion of overlapping area between orthographic projections of the first sub-via holes on the base substrate and orthographic projections of the second sub-via holes on the base substrate is zero.

14. The display panel of claim 13, wherein one of the plurality of auxiliary traces corresponds to a plurality of first via holes, and one of the plurality of first via holes corresponds to one sub-pixel row; and wherein in a same sub-pixel row,
for first via holes, a first gate line and a second gate line corresponding to the same sub-pixel row, orthographic projections of first sub-via holes on the base substrate are overlapped with an orthographic projection of the second gate line on the base substrate; and
orthographic projections of second sub-via holes on the base substrate are located between an orthographic projection of the first gate line on the base substrate and the orthographic projection of the second gate line on the base substrate.

15. The display panel of claim 14, wherein in the same sub-pixel row,
for the second sub-via holes, second via holes and the second gate line corresponding to the same sub-pixel row, the orthographic projections of the second sub-via holes on the base substrate are located between the orthographic projection of the second gate line on the base substrate and an orthographic projection of all the second via holes on the base substrate as a whole.

16. The display panel of claim 4, wherein:
widths of parts, overlapped with orthographic projections of the plurality first auxiliary parts, of the first auxiliary traces in a row direction of the sub-pixels are first widths, and
widths of parts, overlapped with the orthographic projections of the first gate lines, of the first auxiliary traces in the row direction of the sub-pixels are second widths; and wherein the first widths are greater than the second widths.

17. The display panel of claim 16, wherein the parts, having the second widths, of the first auxiliary traces are close to the second connecting holes.

18. The display panel of claim 3, wherein each first auxiliary trace is located in a gap between two adjacent pixel unit columns.

19. The display panel of claim 3, wherein:
at least two adjacent pixel unit columns are taken as a first column group,
one of first column groups corresponds to one first auxiliary trace, and
the one first auxiliary trace is located in a gap between two adjacent pixel unit columns in corresponding one first column group.

20. The display panel of claim 3, further comprising:
a second insulating layer, disposed on a side, facing the base substrate, of the second conducting layer;
an active semiconductor layer, disposed on a side, facing the base substrate, of the second insulating layer;
a third insulating layer, disposed on a side, facing the base substrate, of the active semiconductor layer; and
a light-shielding metal layer, disposed on a side, facing the base substrate, of the third insulating layer; wherein the light-shielding metal layer comprises:
at least one light-shielding electrode, wherein one light-shielding electrode is located in one sub-pixel; and
in a same sub-pixel of sub-pixels in which one light-shielding electrode is located, an orthographic projection of the one light-shielding electrode on the base substrate at least covers an orthographic projection of a channel region of the driving transistor on the base substrate.

21. The display panel of claim 20, wherein the at least one of the sub-pixels further comprises a storage capacitor, wherein:
a first electrode of the storage capacitor is electrically connected with a gate of the driving transistor,
a second electrode of the storage capacitor is electrically connected with the second electrode of the driving transistor; and
the second electrode of the storage capacitor is further electrically connected with the light-shielding electrodes by a third connecting hole.

22. The display panel of claim 3, wherein the detection lines comprise:
first detection traces, located on the first conducting layer and extending in the column direction of the sub-pixels; and
second detection traces, located on the second conducting layer; wherein
the first detection traces are electrically connected with the second detection traces by third via holes penetrating through the first insulating layer.

23. The display panel of claim 22, wherein:
a second detection trace comprises a plurality of second auxiliary parts arranged at intervals, and
in a same detection trace, a first detection trace is electrically connected with corresponding second auxiliary parts by third via holes, respectively.

24. The display panel of claim 23, wherein in the same detection trace,
an orthographic projection of the first detection trace on the base substrate is overlapped with orthographic projections of corresponding second auxiliary parts on the base substrate.

25. The display panel of claim 23, wherein:
orthographic projections of the plurality second auxiliary parts on the base substrate cover orthographic projections of the corresponding third via holes on the base substrate.

26. The display panel of claim 23, wherein in a same first detection trace,
for a plurality of second auxiliary parts electrically connected to the same first detection trace, one second auxiliary part corresponds to one sub-pixel row.

27. The display panel of claim 23, wherein in a same first detection trace,
for a plurality of second auxiliary parts electrically connected to the same first detection trace, one second auxiliary part corresponds to a sub-pixel row, and the sub-pixel row is spaced from another sub-pixel row corresponding to another second auxiliary part by at least one sub-pixel row.

28. The display panel of claim 23, wherein: one of the plurality of second auxiliary parts and one of the plurality of first auxiliary parts correspond to a same sub-pixel row.

29. The display panel of claim 28, wherein in a same sub-pixel row,
for first auxiliary parts and second auxiliary parts corresponding to the same sub-pixel row, second via holes of the first auxiliary parts are staggered with third via holes of the second auxiliary parts.

30. The display panel of claim 23, wherein each second auxiliary part is electrically connected with a corresponding first detection trace by at least three third via holes.

31. The display panel of claim 23, wherein in a same sub-pixel row,
for second auxiliary parts, a first gate line and a second gate line corresponding to the same sub-pixel row, the second auxiliary parts are closer to the second gate line.

32. The display panel of claim 23, wherein: widths of parts, overlapped with the orthographic projections of the plurality second auxiliary parts, of the first detection traces in a row direction of the sub-pixels are third widths, and widths of parts, overlapped with the orthographic projections of the first gate lines, of the first detection traces in the row direction of the sub-pixels are fourth widths; and wherein the third widths are greater than the fourth widths.

33. The display panel of claim 32, wherein the parts, having the fourth widths, of the first detection traces are close to the second connecting holes.

34. The display panel of claim 23, wherein in same gaps each of which is arranged between two pixel unit columns,
for first detection traces and first auxiliary traces arranged in the same gaps, orthographic projections of first sub-via holes corresponding to the first auxiliary traces on the base substrate are overlapped with orthographic projections of the first detection traces on the base substrate.

35. The display panel of claim 22, wherein one first detection trace and one first auxiliary trace are both arranged in a same gap between two adjacent pixel unit columns.

36. The display panel of claim 3, wherein the power lines comprise:
first power traces, located on the first conducting layer and extending in a column direction of the sub-pixels; and
second power traces, located on the second conducting layer; wherein
the first power traces are electrically connected with the second power traces by fourth via holes penetrating through the first insulating layer.

37. The display panel of claim 36, wherein:
the first power traces and the first auxiliary traces are spaced for at least one pixel unit column.

38. The display panel of claim 37, wherein a second power trace comprises a plurality of third auxiliary parts arranged at intervals, and wherein:
in a same power line, a first power trace is electrically connected with corresponding third auxiliary parts by corresponding fourth via holes, respectively.

39. The display panel of claim 38, wherein:
in the same power line, an orthographic projection of the first power trace on the base substrate is overlapped with orthographic projections of the corresponding third auxiliary parts on the base substrate.

40. The display panel of claim 39, wherein:
the orthographic projections of the plurality of third auxiliary parts on the base substrate cover orthographic projections of the corresponding fourth via holes on the base substrate.

41. The display panel of claim 40, wherein:
each third auxiliary part is electrically connected with the first power trace by at least four fourth via holes.

42. The display panel of claim 38, wherein in a same first power trace,
for a plurality of third auxiliary parts electrically connected to the same first power trace, one third auxiliary part corresponds to one sub-pixel row.

43. The display panel of claim 42, wherein one of the plurality of third auxiliary parts and one of the plurality of first auxiliary parts correspond to a same sub-pixel row.

44. The display panel according to claim 43, wherein in a same sub-pixel row,
for third auxiliary parts, a first gate line and a second gate line corresponding to the same sub-pixel row, the third auxiliary parts are closer to the second gate line.

45. The display panel of claim 38, wherein in a same first power trace,
for a plurality of third auxiliary parts electrically connected to the same first power trace, one third auxiliary part corresponds to a sub-pixel row, and the sub-pixel row is spaced from another sub-pixel row corresponding to another third auxiliary part by at least one sub-pixel row.

46. The display panel of claim 38, wherein: widths of parts, overlapped with orthographic projections of the plurality of third auxiliary parts, of the first power traces in a row direction of the sub-pixels are fifth widths, and widths of parts, overlapped with the orthographic projections of the first gate lines, of the first power traces in the row direction of the sub-pixels are sixth widths; and wherein the fifth widths are greater than the sixth widths.

47. The display panel of claim 46, wherein the parts, having the sixth widths, of the first power traces are close to the second connecting holes.

48. The display panel of claim 38, wherein in a same sub-pixel row,
for first connecting holes and third auxiliary parts corresponding to the same sub-pixel row, one of the fourth via holes corresponding to the third auxiliary parts and the first connecting holes are arranged on a same straight line in a row direction of the same sub-pixel row.

49. A display device, comprising the display panel according to claim 1, wherein the display panel comprises:
a base substrate;
a plurality of pixel units, arranged on the base substrate in an array,
wherein at least one pixel unit comprises a plurality of sub-pixels, and at least one sub-pixel comprises a sensing transistor and a driving transistor; and
a plurality of gate line groups, wherein each gate line group comprises a first gate line and a second gate line located at two sides of one respective row of the pixel units;

wherein in a same sub-pixel row, for a first gate line and a second gate line corresponding to sub-pixels in the same sub-pixel row, sensing transistors are located at a side, closer to the second gate line, of the sub-pixels, and driving transistors are located at a side, closer to the first gate line, of the sub-pixels;

wherein, in a same sub-pixel of the at least one sub-pixel, a first electrode of a sensing transistor is electrically connected with a second electrode of a driving transistor by a first connecting hole, and a first electrode of the driving transistor is electrically connected with a power line by a second connecting hole; and wherein in the same sub-pixel row, for two sub-pixels close to each other and located in different pixel units, at least one of signal lines in a region defined by first connecting holes and second connecting holes of the two sub-pixels has a double-layer alignment structure, and double-layer alignments of a double-layer alignment structure of a same signal line are electrically connected with each other.

* * * * *